US011552490B2

(12) United States Patent
Moubedi

(10) Patent No.: US 11,552,490 B2
(45) Date of Patent: Jan. 10, 2023

(54) CHARGING CABLE WITH CHARGE STATE INDICATION

(71) Applicant: Snap Inc., Santa Monica, CA (US)

(72) Inventor: Shaheen Moubedi, Santa Monica, CA (US)

(73) Assignee: Snap Inc., Santa Monica, CA (US)

(*) Notice: Subject to any disclaimer, the term of this patent is extended or adjusted under 35 U.S.C. 154(b) by 303 days.

(21) Appl. No.: 16/796,651

(22) Filed: Feb. 20, 2020

(65) Prior Publication Data
US 2020/0274380 A1 Aug. 27, 2020

Related U.S. Application Data

(60) Provisional application No. 62/809,805, filed on Feb. 25, 2019.

(51) Int. Cl.
*H02J 7/00* (2006.01)
*G01R 31/385* (2019.01)
*G01R 31/382* (2019.01)
*H03K 19/0175* (2006.01)

(52) U.S. Cl.
CPC .......... *H02J 7/0047* (2013.01); *G01R 31/382* (2019.01); *G01R 31/385* (2019.01); *H02J 7/0019* (2013.01); *H02J 7/00041* (2020.01); *H02J 7/0068* (2013.01); *H02J 7/007184* (2020.01); *H03K 19/0175* (2013.01)

(58) Field of Classification Search
USPC ........................................................ 320/128
See application file for complete search history.

(56) References Cited

U.S. PATENT DOCUMENTS 6,172,480 B1  1/2001  Vandelac
2009/0033293 A1  2/2009  Xing et al.
2014/0013428 A1*  1/2014  Brett ..................... G06F 1/26
726/22

(Continued)

FOREIGN PATENT DOCUMENTS

CN  106374581 A  *  2/2017  ............ H02J 7/0086

OTHER PUBLICATIONS

International Search Report and Written Opinion for International Application No. PCT/US2020/019101, dated May 12, 2020 (May 12, 2020)—16 pages.

*Primary Examiner* — Samuel Berhanu
(74) *Attorney, Agent, or Firm* — Culhane Meadows PLLC; Stephen J. Weed

(57) ABSTRACT

A charging cable has a current sensor, a charging state indicator and logic circuitry to operate the indicator based on detected levels of current flow to a chargeable device. If the sensor detects current is below a low threshold, the logic circuitry operates the indicator to indicate that the cable is not connected to any chargeable device. If the sensor detects current at or above a higher threshold, the logic circuitry operates the indicator to provide a perceptible output indicating that the cable is connected to the chargeable device and the current is charging the battery. If the sensor detects current at or above the low threshold but below the high threshold, the logic circuitry operates the indicator to provide a perceptible output indicating that the cable is connected to a chargeable device but is not charging the battery of the device, e.g. when the battery is, or is nearly, fully charged.

14 Claims, 16 Drawing Sheets

(56) References Cited

U.S. PATENT DOCUMENTS

| | | | |
|---|---|---|---|
| 2014/0015462 A1* | 1/2014 | Kim | H02P 3/02 |
| | | | 318/479 |
| 2014/0156879 A1 | 6/2014 | Wong et al. | |
| 2016/0378154 A1* | 12/2016 | Srivastava | G06F 1/266 |
| | | | 713/300 |
| 2017/0012448 A1* | 1/2017 | Miller | H02J 7/0031 |
| 2017/0013876 A1 | 1/2017 | Schennum et al. | |
| 2017/0108910 A1 | 4/2017 | Goh et al. | |
| 2018/0278080 A1* | 9/2018 | Matoba | H02J 7/02 |
| 2018/0309308 A1* | 10/2018 | Saito | H02J 7/0086 |
| 2019/0323886 A1* | 10/2019 | Thompson | G01J 1/44 |
| 2021/0075243 A1* | 3/2021 | Uesugi | H01M 10/425 |

* cited by examiner

Timing Parameters t_DET = Timed delay from I_det going low to Cable assuming Device is detached
t_CHG = Timed delay from I_chg going low to Cable assuming Device is charged
t_RESET = Duration of any hard reset on Device side

FIG. 15A

Timing t_DET t_DET > t_low
t_DET > t_low + t_RESET + t_resume_pulse
t_DET > t_RESET + t_resume_chg

FIG. 15B

Timing t_CHG t_CHG > t_low
t_CHG > t_low + t_RESET + t_resume_pulse
t_CHG > t_RESET + t_resume_chg
t_CHG = k * ½ * LED_pulse_period [where k is odd integer]

** assuming Animation Period = 3s t_CHG = 1.5s, 4.5s, 6.5s, ...

FIG. 15C

CHARGING CABLE WITH CHARGE STATE INDICATION

CROSS-REFERENCE TO RELATED APPLICATIONS

This application claims priority to U.S. Provisional Application Ser. No. 62/809,805 entitled CHARGING CABLE WITH CHARGE STATE INDICATION, filed on Feb. 25, 2019, the contents of which are incorporated fully herein by reference.

TECHNICAL FIELD

The disclosed subject matter includes examples of a charging cable, a chargeable device and a system combining the cable and the device, where the cable includes a state indicator and elements configured to detect and provide responsive indications of various cable-to-device coupling or charging states.

BACKGROUND

Many types of electronic devices, such as portable or wearable devices, have integrated electronics requiring an onboard power supply in the form of a battery. From time to time, such a device is coupled to a source of power to charge the battery. This approach to charging for electronic devices often uses a charging cable connected to a suitable receiver on the electronic device. The chargeable device may provide an indication to the user of the state of the charge on the battery, including during progress of battery charging.

BRIEF DESCRIPTION OF THE DRAWINGS

The drawing figures depict one or more implementations, by way of example only, not by way of limitations. In the figures, like reference numerals refer to the same or similar elements.

FIGS. 15A, 15B, and 15C illustrate several timing aspects of an example of current responsive state indications as in FIGS. 8 to 14, using logic circuitry like that of FIG. 7.

DETAILED DESCRIPTION

Figure 1:
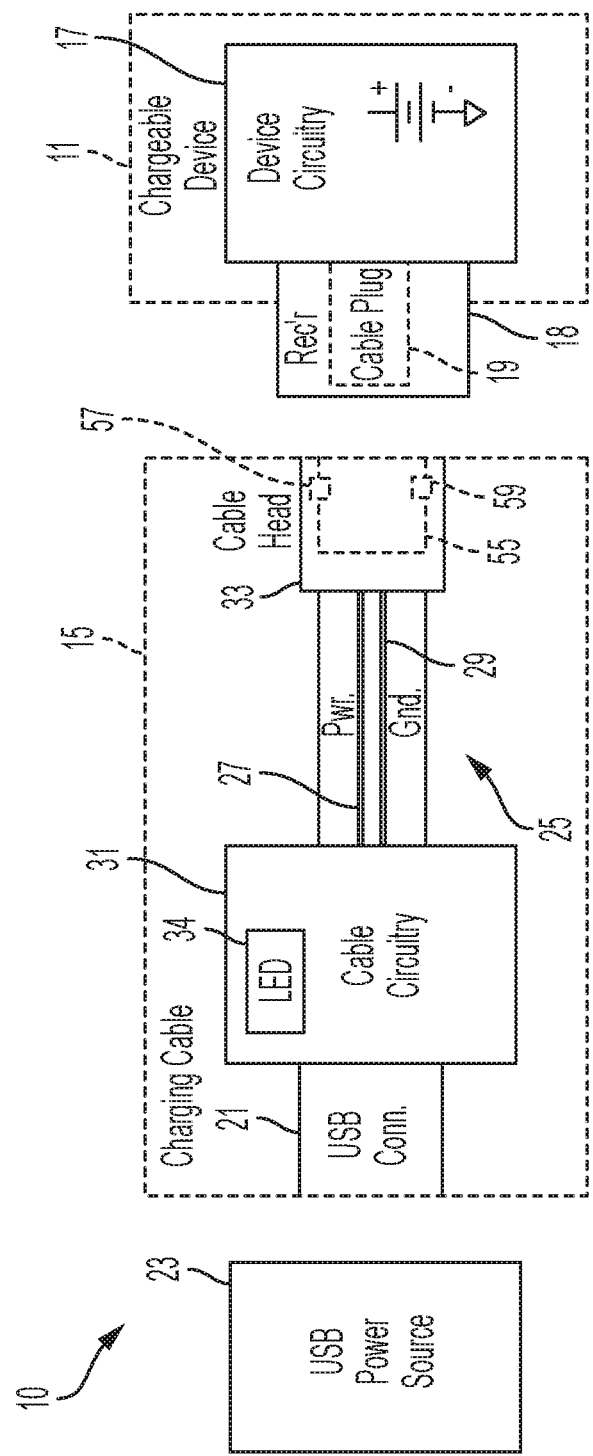
FIG. 1 is a high-level block diagram of an example combination or system, including a charging cable and a chargeable device.

In the following detailed description, numerous specific details are set forth by way of examples in order to provide a thorough understanding of the relevant teachings. However, it should be apparent to those skilled in the art that the present teachings may be practiced without such details.

The descriptions of the examples that follow are intended to be read in connection with the accompanying drawings, which are to be considered part of the entire written description. In the description, relative terms such as "right," "left," "lower," "upper," "horizontal," "vertical," "above," "below," "up," "down," "top," and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "coupled," "connected" and "interconnected," refer to a relationship wherein structures are secured or attached to one another either directly or indirectly through intervening structures, as well as both removable or rigid attachments or relationships, unless expressly described otherwise.

The various examples disclosed herein relate to a cable used in the charging of a battery powered electronic device, to systems that combine such a cable and the chargeable device, and to circuitry of the cable and possibly in the chargeable device to facilitate detection and providing perceptible indications of various connection and charging states.

It is useful to detect cable coupling to the chargeable device and one or more states of charging and to indicate the detected states to a user of the charging cable and the chargeable device. Some chargeable devices have provided various types of such indications. In the examples described herein and shown in the accompanying drawings, however, the charging cable senses and provides indications of cable coupling to the chargeable device and one or more charging states. In some examples below, circuitry of such a charging cable offers the user indications of whether or not the cable is connected to the chargeable device; and if connected whether or not the system is charging the battery of the chargeable device during a primary charging state. When connected but not charging or charging at a slower rate (i.e., during a secondary charging state), for example, the battery of the device typically is approaching or is at a full charge.

Depending on the size and configuration of the cable head and the cable receiver of the chargeable device, there may only be two pins in the cable head to contact only two corresponding contact pads of the receiver. The charging cable, however, in the examples is able to detect whether or not a chargeable device is connected to the cable and to detect at least two charge states while attached based on sensing of current through the pins, e.g. without requiring extra pins or the like in the cable head or extra contact pads in the receiver for connection or charging state sensing. To be effective and provide a good user experience, the examples offer rapid detection of transition to each charging state.

Although other indicator technologies may be used to provide perceptible outputs to a user, e.g. a haptic output device for a visually impaired user, typical examples of the indicator are low power light emitting diodes (LED) or the like that provide visible light outputs. Examples of LED based indications below are configured to handle intermittent disconnections elegantly. The examples also may be configured to optimize size, cost, and efficiency.

The examples detect cable coupling and charging states form the cable side. Detection involves sensing of current over the charging circuit (e.g. via just two pins of the cable head and just two contact pads of the receiver), and comparing sensed current values to two current threshold values. One threshold is a low, connection state current threshold used for detecting device connection to the cable head. The other current threshold is set higher for detecting device charging. When disconnected, there is no current to trip even the low connection state current threshold. Current at or above the charging state current threshold (and thus above the lower connection state threshold) indicates that the chargeable device is drawing current to charge the battery. Current that is at least periodically at or above the connection state current threshold but below the charging state current threshold indicates connection without supply of charging current or supply of a relatively low level of charging current, e.g. when the device is at or nearing a full charge on the battery.

Hence, in some specific examples, the charging cable includes logic circuitry configured to compare level of current detected by the current sensor to first and second thresholds and to control the state indicator in response to results of the comparisons over time to detect different system states. The first threshold is higher than the second threshold. The logic circuitry controls the state indicator to provide a perceptible output of a first type indicating that the cable head is not electrically coupled to the receiver, when the level of current detected by the current sensor is below the lower second threshold. The logic circuitry controls the state indicator to provide a perceptible output of a second type indicating that the cable head is electrically coupled to the receiver and the current flow is charging the battery of the chargeable device during a primary charging state, when the level of current detected by the current sensor is at or above the higher first threshold. The logic circuitry also controls the state indicator to provide a perceptible output of a third type indicating that the cable head is electrically coupled to the receiver but the current flow is charging the battery of the chargeable device at a lower rate during a secondary charging state, when the level of current detected by the current sensor is below the first threshold but also is at or above the second threshold.

The chargeable device in some examples also pulse modulates the current it draws from the charging cable, to facilitate some aspects of the coupling and charge state detections. In such examples, current pulses are modulated on the current drawn through the cable, by the circuitry of the chargeable device, to trip the two current sensing thresholds under certain conditions. The modulated current pulses in some examples have two distinct pulse amplitudes. A high current pulse amplitude periodically trips the higher current threshold for charging state detection, for example, during a Precharge/Trickle Charge state. A lower current pulse amplitude trips the lower current threshold for connection detection but not the higher charging state current threshold, for example, during a lower portion of a constant Voltage state or in an End of Charge (EOC) state.

Based on current sensing, logic of the charging cable in an example below drives an LED type state indicator to be off (steady light-OFF output condition) when the device is not detected through the cable head and cable plug (disconnection, the detected current is below the low threshold value); pulses the LED to indicate charging of the battery during a primary charging state when current meets or exceeds the high threshold during any of several possible active charging states (e.g. during a Precharge/Trickle Charge state, a Constant Current charging state, or a higher current portion of a Constant Voltage charging state); and drives the LED to provide a steady-ON output indicating the cable is electrically coupled to the device but the current flow is not charging the battery of the chargeable device or is charging the battery at a relatively slow rate during a secondary charging state (device connection and for example that the battery is, or nearly is, fully charged).

Reference now is made in detail to the examples illustrated in the accompanying drawings and discussed below. FIG. 1 illustrates an example of the overall combination of elements forming a system 10. As shown, the system 10 includes a chargeable device 11 and a charging cable 15.

The chargeable device 11 includes device circuitry 17 that, as shown in later FIG. 3, includes a battery and a battery charger circuit coupled to the battery. The chargeable device 11 also includes a receiver 18 for coupling to a cable head 33 of the charging cable 15. The example receiver 18 allows for rotatable coupling and for example includes a cable plug 19 that includes first and second charging contact pads coupled to supply charging current/power to the battery charger circuit. An insulator electrically separates the contact pads. In an example shown in FIG. 2 as discussed in more detail later, the contact pads of the plug 19 include a power contact pad coupled to supply current to the battery charger circuit and a ground contact pad coupled to the ground of the chargeable device 11 and may include an insulator electrically separating the power contact pad and the ground contact pad. It should be apparent, however, that the contacts or contact pads of the receiver need not strictly be power or ground; and either pad may serve the alternate function. For convenience only, further discussion of the non-limiting examples will sometimes refer to a specific contact or pad as a power contact pad and the other contact or pad as a ground contact pad. Although the description herein describes a specific example of the cable head 33 of the charging cable 15 and the cable plug 19 of the chargeable device 11, it is to be understood that this in only one example and that the invention may utilize other types of connectors for interconnecting the charging cable with the chargeable device such as a conventional 2-wire connector.

The charging cable 15 includes a connection to power. Although other types of connectors and associated power sources may be used, the power connector in the example is a male USB type connector 21. Although not necessarily a part of the system 10, the drawing also shows a compatible power source that, in an example using USB connector 21, would be a USB power source 23. Examples of a USB power source 23 include a computer, a wall adapter (e.g. an AC charger sometimes referred to as a "charging brick"), or a car charger, with a female USB port configured to receive the male USB connector 21 of the charging cable 15.

The charging cable 15 in the example includes an insulated wire bundle 25, which includes a power bus 27 and a ground bus 29. Other wires or buses may be included for other purposes. In the example, the wire bundle 25 connects the cable circuitry 31 to the cable head 33. Connections of the cable circuitry 31 to the pins of the USB connector 21 are not separately shown. The illustrated arrangement, however, is a non-limiting example, and other arrangements of the cable elements may be used. In an alternative configuration, there may be an additional wire bundle between the USB connector 21 and the cable circuitry 31, possibly with additional wires (e.g. data bus wires). In another alternative configuration, the cable circuitry 31 may be connected to or integrated with the cable head 33, with power and ground buses internal to the circuitry 31 or the cable head 33.

In an example for rotatable coupling, the cable head 33 has a recess 55 configured to accept insertion of the cable plug 19 when the head 33 of cable 15 is rotatably coupled the receiver 18 of the chargeable device 11. The cable head 33 has a pair of pins 57, 59 to contact pads of the receiver 18, e.g. on the cable plug 19. A more detailed discussion of the cable plug 19 and the cable head 33 follow, with reference to FIG. 2. An example of the cable circuitry is discussed later with respect to FIGS. 6 and 7.

The example charging cable 15 also includes an output device or indicator intended to provide information regarding detected connection or charging states to a user of the system 10. The example uses a light emitting diode (LED) 34 as the indicator. Other light output elements or other types of indicators may be used in place of or in addition to the LED 34. The LED or other indicator is part of the charging cable 15. In the example of FIG. 1, the LED 34 is implemented as part of the cable circuitry 31, although the indicator may be located elsewhere on the cable 15 (e.g. on the cable head 33 with one or more additional wires between the cable circuitry 31 and the cable head 33 to allow logic of the cable circuitry 31 to operate the LED 34). Examples of LED based indications of connection and charging states sensed by the cable circuitry 31 are described in more detailed below.

Figure 2:
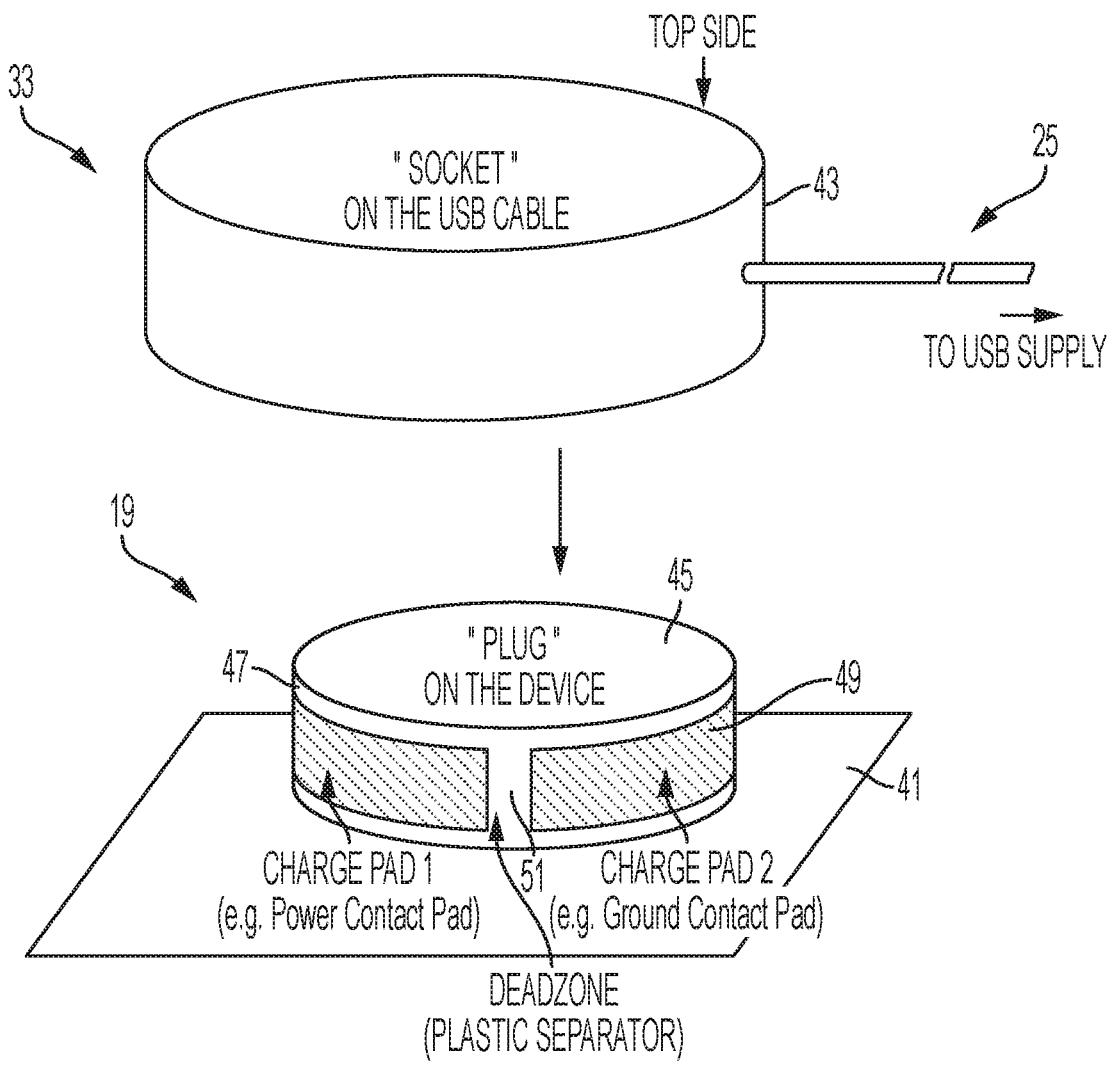
FIG. 2 is an isometric view of examples of a socket for the head of the charging cable and a cable plug as (or as part of) the receiver on the chargeable device, for example, for a rotatable type coupling of the cable to the chargeable device.

Referring now to the rotatable coupling example of FIG. 2, the cable plug 19 is shown as a cylindrical post extending from a wall 41 of a housing or the like of the chargeable device. Although other shapes may be used, a fairly round cylindrical shape is particularly effective at enabling rotation of a cable head having an appropriately shaped mating socket recess. The drawing shows an example of the cable head 33 in the form of a cylindrical socket 43 connected laterally to the end of the wire bundle 25. For convenience, the cable circuitry is omitted from the illustration in FIG. 2. In the illustrated example, the cable plug 19 is exposed on an exterior surface of the housing of the chargeable device, and there are no nearby obstructions that might impact or interfere with rotation of the cable around the cable plug 19 while the plug 19 and cable head 33 are coupled together for device charging.

Although not shown, the cable plug 19 may be recessed as part of the receiver in the device, and the other elements of the cable (e.g. wire bundle 25 or circuitry 31 of FIG. 1) may connect axially to the end of the cable head socket 43 (e.g. to the top side in the illustrated orientation) opposite the socket recess intended for receiving the cable plug 19. In such an arrangement, the charging receiver on the device would include a cylindrical recess somewhat larger than the outer lateral perimeter of the cylindrical socket 43, and the cable plug 19 would be located approximately at the center of that recess. If the chargeable device does not have a receiver with such a cylindrical recess, however, the outer shape of the socket 43 need not be cylindrical and may have some other design or shape, for example, to facilitate a user's grasp of the cable head socket 43 to couple or remove the socket 43 to or from the cable plug 19 or to turn the socket 43 about the axis of the cable plug 19.

The cable plug 19 is configured for insertion into a cylindrical implementation of the recess 55 (FIG. 1), which would be formed in the socket 43 of the cable head 33. The cable plug 19 includes two charging contact pads of a suitable conductive material (e.g. metal) separated by an insulator, such as a suitable plastic. Various configurations of the contact pads and separator may be used. The example in FIG. 2 utilizes a post 45 made of plastic or another insulating material. The post 45 is generally cylindrical in shape. Each of the contact pads 47 and 49 is formed of the conductive material, such as a metal. At least some surface area of each of the contact pads 47, 49 is exposed for possible electrical contact by one or more of the pins 57, 59 (FIG. 1) which would be in the socket 43 of the example cable head 33. As shown in FIG. 2, the contact pads 47, 49 are located to present exposed contact surfaces at different locations around the cylindrical lateral surface of the post 45 of the cable plug 19. In the illustrated orientation, the first (1) charging contact pad 47 is mounted on the left side of the cylindrical lateral surface of the post 45, and the second (2) charging contact pad 49 is mounted on the opposite (right) side of the cylindrical lateral surface of the post 45.

The metal forming the contact pads may be deposited on the cylindrical lateral surface of the post 45, in which case, the contact pads 47, 49 may be slightly raised or extended outward from the cylindrical lateral surface of the post 45. Alternatively, the metal forming the contact pads 47, 49 may be embedded in the material of the post 45 and have a thickness so as to form a smooth cylindrical lateral surface of the plug 19. In another alternative example, the metal forming one or both of the contact pads 47, 49 may be embedded sufficiently to form one or more slight indentations in the cylindrical lateral surface of the plug 19. In any of these configurations, however, surfaces of the contact pads 47, 49 are exposed for mechanical and electrical contact with pins (e.g. pins 57 and 59 as in FIG. 1) included in the cable head socket 43.

In the example of FIG. 2, the insulting material of the post 45 provides structural support for the contact pads 47, 49 and forms the separator between the contact pads to electrically insulate or isolate the contact pads 47, 49 from each other. The insulating material separates the metal or the like of the contact pads on the opposite sides of the structure of the plug (e.g. laterally across the vertical axis of the cylindrical post 45 in the illustrated orientation). The example plug configuration has exposed sections on the cylindrical lateral surface of the insulting material of the post 45, located in-between adjacent ends of the exposed surfaces of the contact pads 47, 49. One of the exposed sections 51 on the cylindrical surface of the post 45 that is in-between ends of the contact pads 47, 49 is visible in the illustrated orientation. A second similar section is located on an opposite (back) side of the cylindrical post 45 and is not visible in the drawing.

Each of the exposed insulating regions 51 can be relatively small so as to minimize the size of any potential deadzone. For example, the region 51 may only be large enough to avoid electrical current flow across the region from an end of one contact pad to the adjacent end of the other contact pad. In another example, the region 51 may be slightly wider than the width of the pins 55, 57 (or the width of largest of the pins 57, 59) of the cable head 33 so that a pin in the cable head cannot concurrently contact both contact pads 47, 49.

Figure 3:
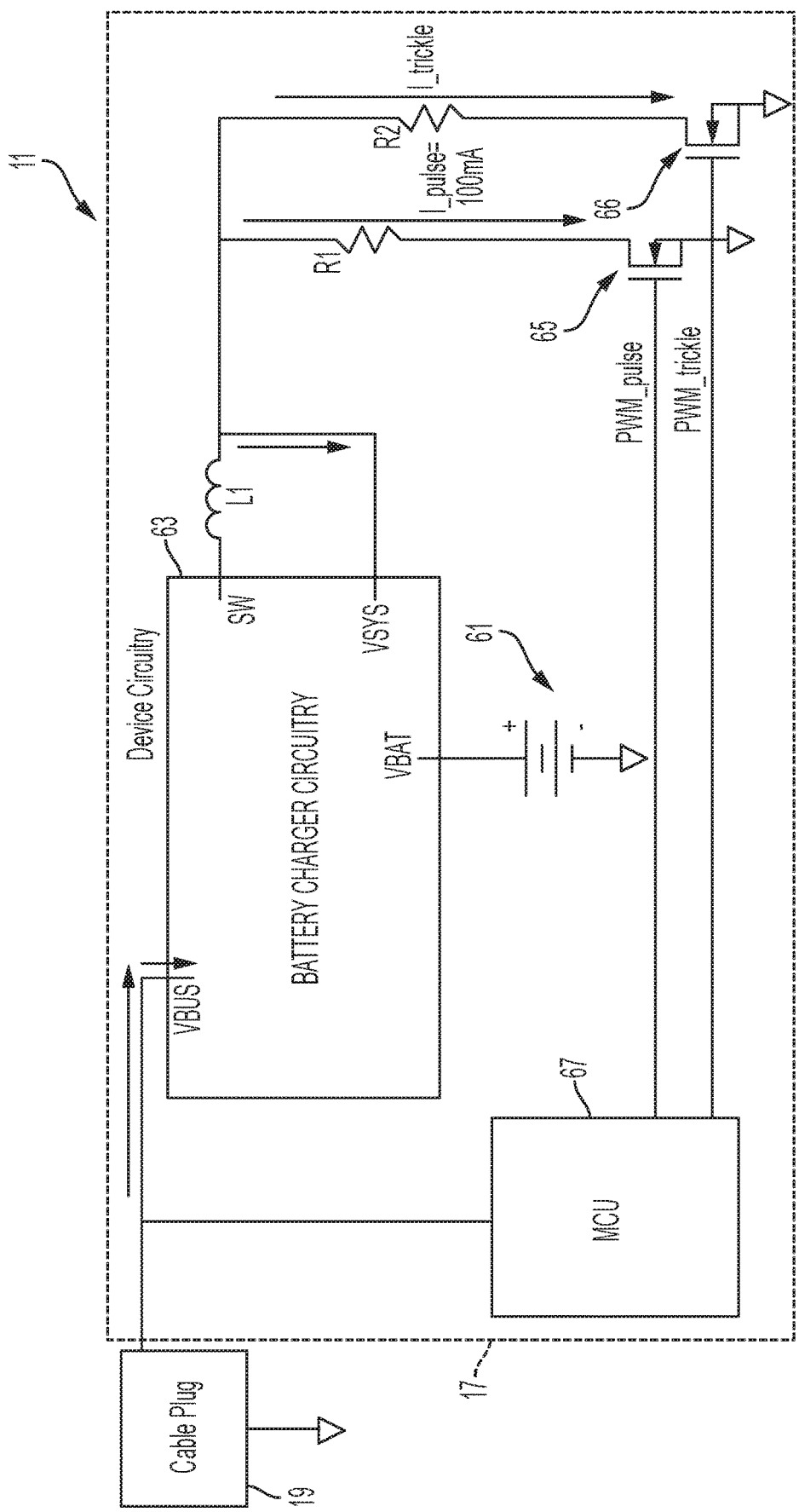
FIG. 3 is a functional block diagram of an example of a downstream battery powered chargeable device to be charge, for example.

FIG. 3 is a functional block diagram of an example of elements of the battery powered chargeable device 11, which here includes device circuitry 17 and a cable plug 19 (as or as part of the receiver). Although other receiver and contact pad arrangements may be used, the cable plug 19 in the device example of FIG. 3 may be implemented as discussed above relative to FIG. 2 so as to include a two charging contact pads. With such an example configuration, a contact pad for power is coupled to supply power to the battery charger circuitry 63 at the VBUS port. The other contact pad would connect to the ground of the chargeable device 11. The device circuitry 17 includes a battery 61 and the battery charger circuitry 63 coupled to the battery 61. A variety of known circuits may be used to implement the battery charging circuitry 63, for example, based on the type and size of the battery 61. The positive terminal of the battery 61 connects to the battery charger circuitry 63, and the negative terminal of the battery 61 connects to the ground of the chargeable device 11.

Device electronics if any that may draw power from the battery 61 for general functions of the device (other than the charging functions under consideration herein) are omitted for convenience. The charging cable and charging technologies discussed here, may apply to any of a wide variety of portable or wearable devices that utilize rechargeable batteries to power the particular electronic components or act as a battery pack to supply charge to other equipment.

The device circuitry 17 in the example also includes a first switch 65 and a second switch 66 coupled to draw current from the battery charger circuitry 63. The switches 65, 66 in the example are controlled to selectively shunt additional current to ground, which causes the particular type of battery charger circuitry 63 to add pulse modulation of two different amplitudes to the current flow through the charging path formed by the cable plug 19 and the cable head 33. Any switching device configured to switch a suitable amount of current may be used, such as any of a variety of switching transistors. The drawing for example, shows a field effect transistor (FET) as the switch 65 and a field effect transistor (FET) as the switch 66.

A variety of switch connections to the battery charger 63 and possibly a variety of intervening or associated circuit elements may be utilized. In the example, the switch 65 connects to a switch (SW) port of the battery charger circuitry 63 via a resistor R1 and an inductor L1. Similarly, the switch 66 connects to the switch (SW) port of the battery charger circuitry 63 via a resistor R2 and the inductor L1. A path is also provided from the junction between the inductor L1 and the resistors R1, R2 to a system voltage port (VSYS) of the battery charger circuitry 63. Each switch 65 or 66 in the example is series connected from the resistor R1 or R2 to the ground of the chargeable device 11. The device circuitry 17 also includes a device controller that provides a signal (PWM_pulse) to control the switch 65 and provides a signal (PWM_trickle) to control the switch 66. Although discrete logic, a field programmable gate array, other programmable processor or the like may be used, the example utilizes a programmable micro-control unit (MCU) 67 as the controller of the chargeable device 11.

The resistors R1 and R2 are selected so that the pulses provided by closing switch 66 will be higher than the pulses produced by the closing of switch 65. Also, the resistor values are chosen so that addition of the pulses in different states will exceed different thresholds when added to the regular current draw by battery charger circuitry 63. For example, the peaks of the pulses added to an otherwise low current flow via operation of the switch 65 and the resistor R1 will periodically meet or exceed a low current threshold value I_detect used to detect connection, while the cable 15 is coupled via the receiver to the head of the charging cable 15. In such an example, the peaks of the pulses added to a current flow that is at or above that low current threshold but otherwise may not trip an even higher charging state current threshold I_chg will cause the modulated current to periodically meet or exceed that higher charging state current threshold I_chg, while the cable 15 is coupled via the receiver to the head of charging cable 15. The threshold levels and the pulse amplitudes (and thus the values of the resistors R1 and R2) will be selected based on the charging requirements of the particular type of battery 61 utilized in the particular chargeable device 11.

The two switches and the associated resistor/inductor circuitry are given by way of non-limiting example only; and other circuit arrangements for pulse modulating the current draw to have two different amplitudes in different states of the charging current profile may be utilized. For example, an alternate approach might use a single switch controlled by the MCU 67 and a variable impedance device in series with the switch, where the impedance is set to different impedance values (to establish different pulse amplitudes) in different states of the charging current profile.

As noted, the device circuitry 17 also includes a device controller, shown by way of example as the MCU 67. An MCU typically is a system on a chip (Soc) including a processor, memory, peripheral input/output (I/O) interfaces and ports, and possibly other circuit components. For example, a single SoC might incorporate the battery charger circuitry as well as circuitry forming the MCU. For purposes of the present discussion, the MCU 67 controls functions related to charging of the battery, although the MCU may perform other functions relative to the device 11 depending on the device type or applications for the particular electronic device 11. It should be apparent, however, that other controller implementations may be used. Functions of the MCU 67 are determined by executable program instructions or configuration data installed in the memory of the MCU, e.g. as firmware.

In the example chargeable device 11, the MCU 67 forming the device controller is responsive to power from the cable plug 19 and configured to operate the switches 65, 66 to cause the charger circuitry 63 to pulse modulate current through the cable plug 19 to provide state indication to circuitry 31 of the charging cable 15 (see FIG. 1). In such an example implementation for supporting state detection, the control of the battery charger circuitry 63 by the MCU 67, configures the device circuitry 17 to implement a regulated current profile for charging of the battery 61 over an interval of time and to add modulation current pulses to the current flow through the cable plug 19 and the charging cable 15 during some parts or sub-intervals of the current draw profile.

Figure 4:
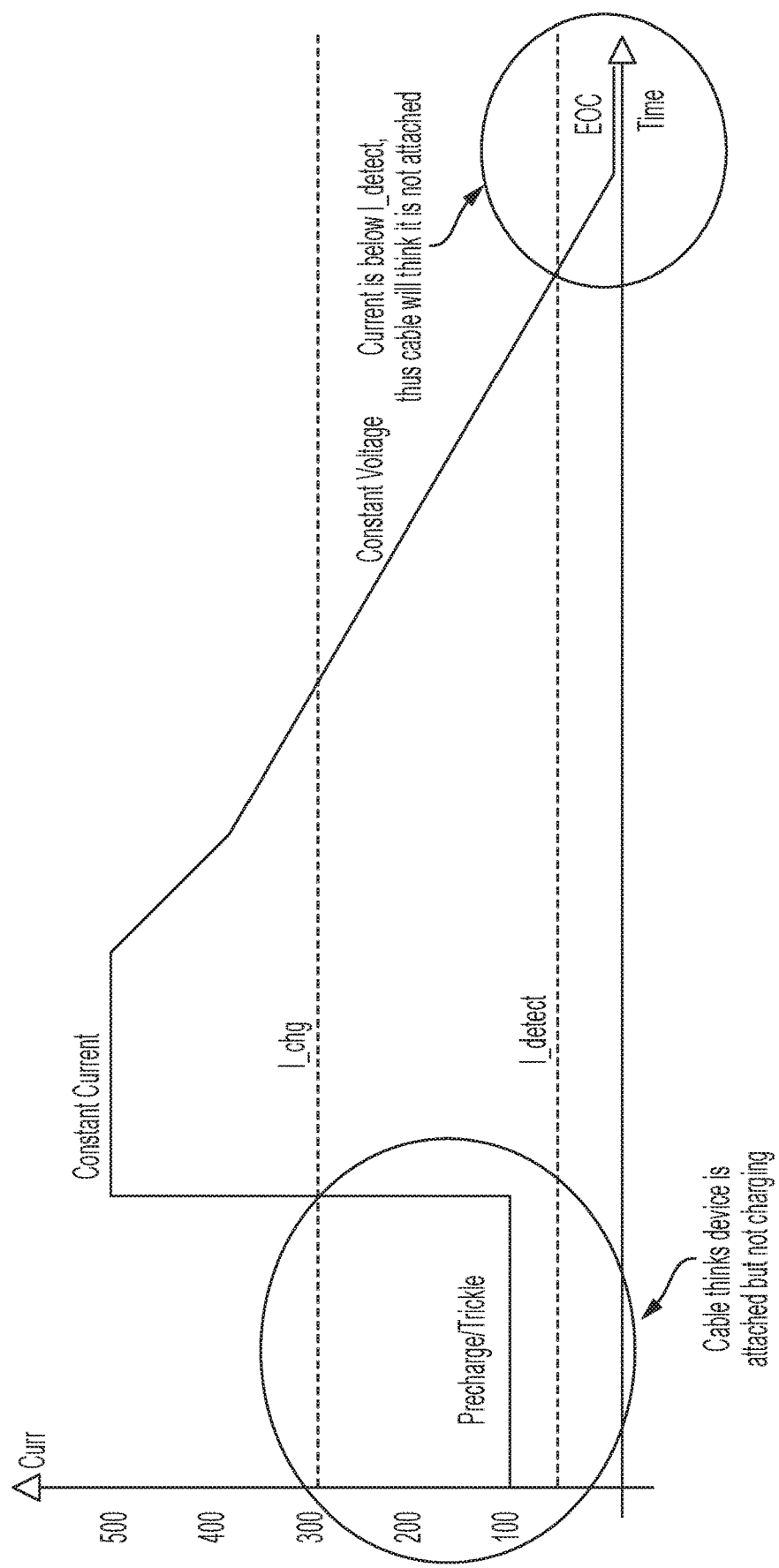
FIG. 4 is a graph or profile of an example current draw by the chargeable device in several states as well as two current detection thresholds useful for indication of various coupling or charging states.

FIG. 4 is a graph or profile of an example current draw by the example chargeable device 11 of FIGS. 1 and 3 for battery charging (shown without optional pulse modulation). The current levels at the various stages of the profile are given by way of example only. The device 11 may implement different levels or a profile with different stages, for example to address the charging requirements of the particular type of battery 61 utilized in the particular chargeable device 11.

With reference to the example of FIG. 4, when the device 11 is coupled to a charging path through the cable plug 19, the regulated current flow implements several states of the profile of FIG. 4. In an initial part of the example profile (e.g. during a sub-interval when there is connectivity with the cable 15 but charge on the battery 61 is above a certain percentage), the battery charging circuitry 63 draws approximately 100 milliamps for precharge or trickle charge current. At a later time (second part of the profile), e.g. when certain conditions of MCU operation or of the battery charge are met, the battery charging circuitry 63 enters a primary charging state (e.g., drawing approximately 500 milliamps constant charging current, for rapid full-power charging of the battery 61). At a later time, e.g. when the battery reaches a particular threshold for percentage of charge, the battery charging circuitry 63 enters a secondary charging state (e.g., drawing current to apply a constant voltage to the battery 61). In this third part of the profile, while the voltage remains constant, the current flow ramps down until the battery is fully charged, and the device 11 reaches an end of charging (EOC) part of the profile drawing a minimal current level. The current values shown in the various parts of the profile are examples only and other values would apply, for example, when charging other types of batteries 61.

FIG. 4 also shows examples of two current thresholds for use by the circuitry 31 (FIG. 1) of the charging cable 15 for state current responsive detection. A first current detection threshold value (I_chg) is used for primary charging state detection. A second current detection threshold value (I_detect) relates to connection state detection. The first current threshold value I_chg is higher than the second current threshold value I_detect. Detection of a current value below the threshold value I_detect indicates that the charging cable 15 is not connected to a chargeable device 11. Any current level at or above the second current threshold value I_detect (including current at or above the higher first current detection threshold value I_chg) indicates that the charging cable 15 is connected to a chargeable device 11. A current value at or above the second, lower threshold value I_detect therefore indicates that the charging cable 15 is connected to the chargeable device 11; and the current value at or above the first, higher threshold value I_chg indicates that the battery charging circuitry 63 is drawing current to charge the battery 61 during a primary charging state. A current value at or above the threshold value I_detect but below the threshold value I_chg indicates that the charging cable 15 is connected to the chargeable device 11 but the battery charging circuitry 63 is not drawing current to charge the battery 61 (see FIG. 3) or the battery charging circuit is in a secondary charging state.

As outlined above, when the battery is sufficiently charged (e.g., at or near a full charge), in the EOC state of the illustrated profile, it is desirable to sense current as an indication to the cable circuitry 31 that the chargeable device 11 is still electrically connected to the charging cable 15. A variety of techniques may be used to facilitate such detection. For example, the chargeable device may be configured to draw a low level current flow sufficient to trip the I_detect threshold. Any current flow could work if a current sensor with a threshold that is sufficiently low enough is used. For example, the idle system current draw of the chargeable device 11 could be enough by itself to trip the I_detect threshold depending on the type or configuration or the application of the chargeable device. Similarly, it is desirable to sense current as an indication to the cable circuitry 31 that the chargeable device 11 is charging its battery 61 in all charging states of the profile; and a variety of techniques may be used to facilitate such detection. For example, the I-chg charge state current detection threshold could be set above the connection state current threshold I_detect but below the precharge/trickle current level (e.g. below 100 milliamps) in the example current draw profile of FIG. 4.

Figure 5:
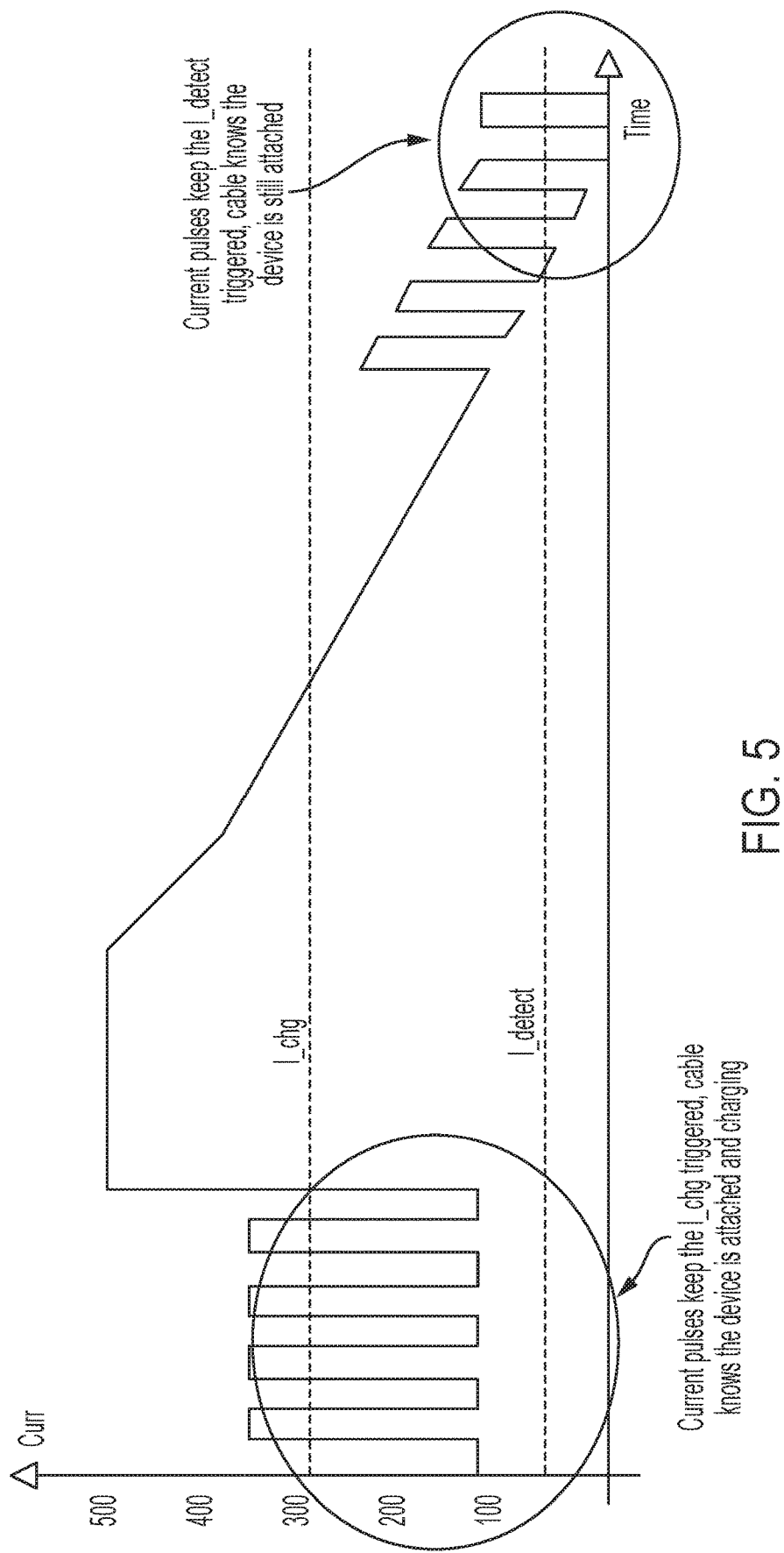
FIG. 5 is a graph or profile of an example current draw by the chargeable device similar to FIG. 4 but also showing modulation of the current in two or more parts of the current draw profile.

To allow for a lower power consumption in a low current state, an example chargeable device draws an idle system current for the chargeable device 11 that is as low as possible for the device circuitry. Rather than set the connection state current threshold I_detect low to detect such idle state current flow, which might lead to false connection detections due to static or noise, the cable circuitry 31 utilizes a connection state current threshold I_detect that is somewhat higher as shown in FIGS. 4 and 5. In such a system example, the cable circuitry 31 utilizes an I-chg charge state current detection threshold that is somewhat above the precharge/trickle current level, to provide a larger distinction between the thresholds and avoid noise in the idle state inadvertently tripping the I-chg charge state current detection threshold. Instead of relying on the regular current draw alone to trip the relevant threshold(s) in all states of the current draw profile, an example implements thresholds like those of FIGS. 4 and 5 adds pulse modulation to the current draw (FIG. 5).

The non-limiting example shows a current detection threshold value (I_detect) of about 60 milliamps for connection detections, and the example shows a current detection threshold value (I_chg) of about 300 milliamps for charging detection. These thresholds are appropriate for a battery 61 of a particular type or technology and the associated type of battery charging circuitry 63. Other threshold values would be selected for use with other battery types and corresponding charger circuitry.

With the example profile shown in FIG. 4, the current drawn through the charging path through the cable head and the cable plug exceeds the I_detect threshold value in the precharge or trickle state, the constant current state and most of the constant voltage state. As the battery nears full charge late in the constant voltage state, the current drawn through the charging path through the cable head and the receiver drops below the I_detect value that the cable uses for connection detection. Also, the current draw in the end of charging (EOC) state is below the I_detect value that the cable uses for connection detection. Hence, in the low current portion of the constant voltage state and the EOC state, the current is too low to trip the connection detection. Also, the current in the precharge or trickle state and the current in a portion of the constant voltage state falls below the I_chg threshold value used for detecting charging, even though the battery charger circuitry 63 is drawing charging current. To address these situations where the actual current drawn by the chargeable device 11 would not trip the appropriate threshold, the example device circuitry 11 of FIG. 3 introduces periodic pulse modulation via periodic operation of the switches 65 and 66. An example of such modulation appears in FIG. 5.

Generally, where the current drawn by the chargeable device 11 might otherwise fall below the I_detect threshold used by the cable circuitry 31, the addition of periodic pulses causes peaks of the modulated current to meet or exceed the I_detect threshold. Similarly, where the current drawn by the chargeable device in at least one charging state might otherwise meet or exceed the I_detect threshold but not the I_chg threshold used by the cable circuitry 31, the addition of periodic pulses causes peaks of the modulated current to meet or exceed the I_chg threshold.

FIG. 5 is a graph or profile of an example current draw by the chargeable device similar to FIG. 4 but also showing an example of such pulse modulation of the current. As outlined earlier relative to FIG. 3, the MCU 67 operates the switch 65 to pulse modulate current through the cable plug 19 to add pulses of one amplitude and operates the switch 66 to pulse modulate current through the cable plug 19 to add pulses of another amplitude. Although the relationships of the two amplitudes may vary, e.g. for different applicable thresholds or for different currents levels in the stages of the applicable current draw profile, the amplitude of the pulses (first pulse amplitude) provided by the operation of the switch 66 is higher than the amplitude of the pulses (second pulse amplitude) provided by the operation of the switch 65. The resulting pulses of the two amplitudes increase current drawn by the device 11 where appropriate to trip the connection detection and charge detection thresholds used by the cable circuitry 31.

With reference to FIGS. 3 and 5, when the switches 65 are in its open state, the battery charger circuitry 63 draws current as shown in FIG. 4. Each time the switch 65 is periodically closed, current flows through the switch 65 to ground causing the battery charger circuitry 63 to draw an additional amount of current through the charging path formed by the cable plug 19 and the cable head 33 to add a pulse of the second amplitude (as determined by the resistance of R1). Switching back and forth between the open and closed states of the switch 65 produces pulses of the first magnitude and causes the battery charger circuitry 63 to superimpose corresponding pulses on the flow of current through the charging path formed by the cable plug 19 and the cable head 33. Similarly, each time the switch 66 is periodically closed, current flows through the switch 66 to ground causing the battery charger circuitry 63 to draw an additional amount of current through the charging path formed by the cable plug 19 and the cable head 33 to add a pulse of the first, higher amplitude (as determined by the resistance of R2). Switching back and forth between the open and closed states of the switch 66 produces pulses of the second magnitude and causes the battery charger circuitry 63 to superimpose corresponding pulses on the flow of current through the charging path formed by the cable plug 19 and the cable head 33.

The amplitude of the modulation pulses created by the operation of switch 65 is determined by the value of the resistor R1. The value of R1 is chosen to provide a low amplitude current pulse for addition to the current flow that will be higher than the threshold I-detect in otherwise low current states, for example, sufficient for detection in a low current connection state such as the end of charge (EOC) state of FIG. 5.

The amplitude of the modulation pulses created by the operation of switch 66 is determined by the value of the resistor R2. The value of R2 is chosen to provide a somewhat higher amplitude current pulse for addition to the current flow in at least one charging current states that is above the connection detection threshold I_detect but may be below the charge state detection threshold I_chg (in the absence of pulses). For example, in the precharge or trickle charge state, the added pulses provide a periodic current amplitude that is sufficient for detection of battery charging as shown in FIG. 5.

Pulses of the lower amplitude produced by periodic closing of the switch 65 are added to the current draw during the lower portion of the constant voltage portion of the current draw profile and during the EOC state, in the example. The peaks of those lower amplitude pulses of the modulated current rise to a level at or above the I_detect threshold level. Based on appropriate timing by the cable circuitry 31, the cable 15 is able to sense the peaks of the current pulses periodically exceeding the I_detect threshold level so as to maintain an indication of connection of the cable head 33 with the cable plug 19, e.g. to show availability of a charge path should the MCU or the battery charger circuitry determine to increase current flow for charging. To the user, a LED or the like provides an output typically informing the user that the battery is adequately charged.

The drawing represents an example in which pulses of the higher amplitude produced by periodic closing of the switch 66 are added to the current draw during the precharge or trickle charge part of the profile. The peaks of those higher amplitude pulses of the modulated current rise to a level at or above the I_chg threshold level. Based on appropriate timing by the cable circuitry 31, the cable 15 is able to sense the peaks of the current pulses periodically exceeding the I_chg threshold level so as to maintain an indication of charging during the precharge or trickle charge part of the profile.

Figure 6:
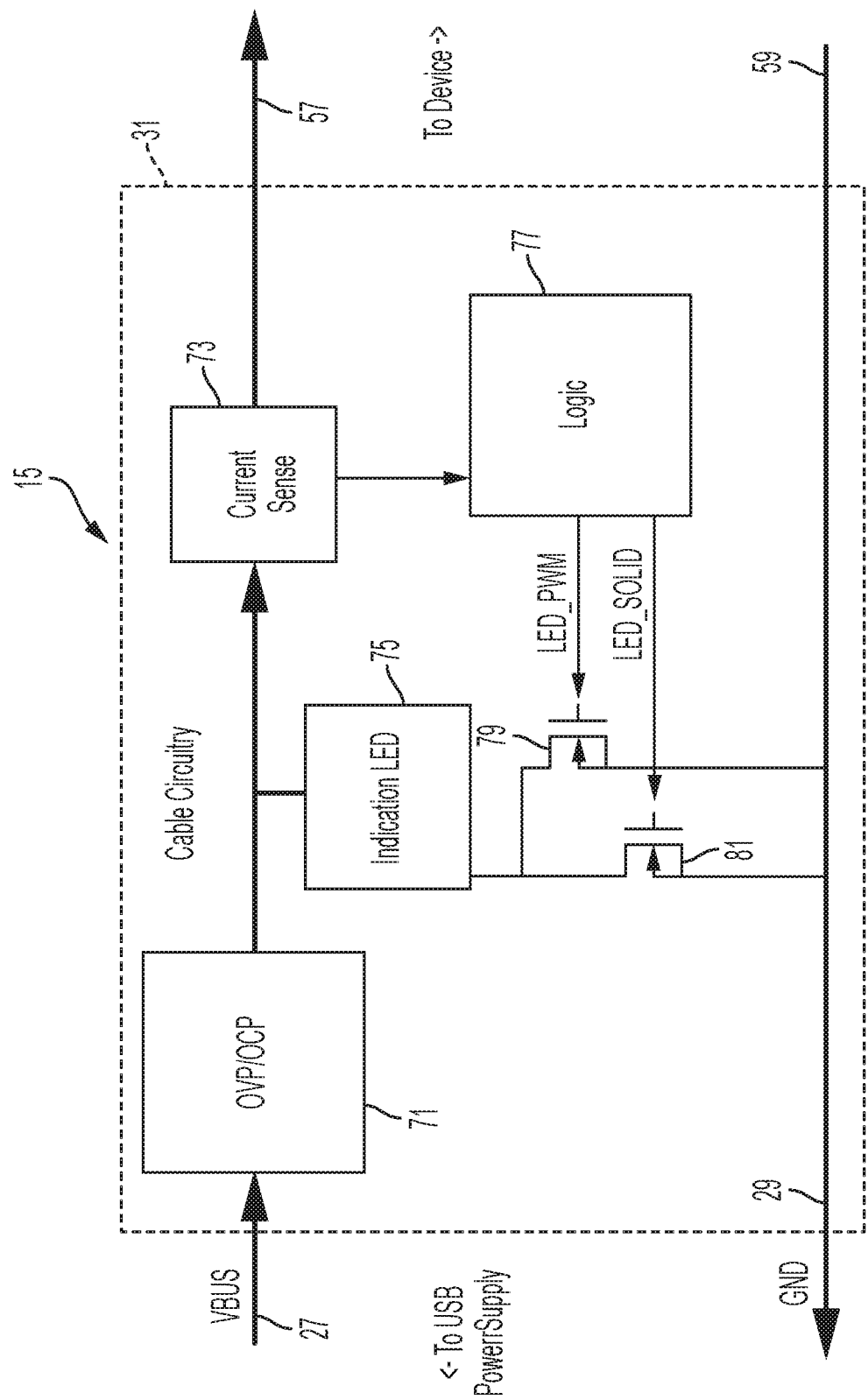
FIG. 6 is a functional block diagram of an example of the charging cable.

FIG. 6 is a functional block diagram of an example of the charging cable 15 with current sensing for state detection and a state indicator. The connection to the USB type power supply (see FIG. 1) includes a power bus 27 shown as the VBUS in FIG. 6, for USB compatible connectors. The wiring going to the USB type power supply also includes a ground bus 29. The cable circuitry 31 in this example includes a protection circuit 71 that provides either one or both of over-voltage protection (OVP) or over-current protection (OCP). Power from the protection circuit 71 flows through a current sensor 73 to the power pin 57. The ground bus 29 connects to the ground pin 59.

The cable circuitry 31 includes an LED 75, which acts as the state indicator in this non-limiting example. The LED 75 connects to power on the protected side of the OVP/OCP circuit 71. The LED 75 connects to the ground bus via one or more switches controlled by a logic circuit 77. The example shows two switches 79 and 81. Of course other arrangements of the LED, the switch or switches and the connections thereof to power and ground may be utilized. In the example, the logic circuit 77 provides a pulsing signal (LED_PWM) to periodically open and close the switch 79, to produce a perceptible pulsing of the light output from the LED 75, for the state indication when the device 11 is drawing sufficient current to actively charge the battery 61. The logic circuit 77 provides a steady state signal (LED_SOLID) to close the switch 81, to produce a perceptible steady-ON light output from the LED 75, for the device-connected-but-not-charging state indication, e.g. when the battery 61 is, or nearly is, fully charged at EOC in a secondary charging state. The logic circuit 77 provides steady state signals to both switches 79, 81 to open both of the switches 79, 81 and thereby hold the LED OFF (steadily producing no light) as a perceptible indication of no detected connection between the cable 15 and the chargeable device.

In the example of FIG. 6, the switches 79 and 80 are connected in parallel from the LED 75 to ground at 29. LED light output is OFF only when both switches are open. There will be light emission if either one or both of the switches 79 and 80 are closed. For example, to provide a pulsing LED output from the LED 75, the logic circuit 77 periodically opens and closes the switch 79 while the switch 81 is open. The LED 75 will provide continuous light output if the switch 81 is continuously closed. While the 81 is continuously closed, the switch 79 may be open, or the switch 79 may still be periodically opening and closing. The switches 79, 81 and the LED 75 are configured so that the closed switch 81 effectively overrides the operation of the switch 79. For example, the LED 75 may have a maximum current limitation that is met with the switch 81 closed, in which case, no more current is drawn when switch 79 periodically closes even if some of the maximum current through the LED 75 flows through closed switch 79. Even if some additional current flows each time the switch 79 closes, the elements 75, 79, 81 are configured so that any increase in light output from the LED 75 is low enough so that such extra periodic light output does not appear perceptible to a typical user. Hence, the light output from the LED 75 appears to be steady-ON when switch 81 is closed, even if switch 79 is periodically operated.

Figure 7:
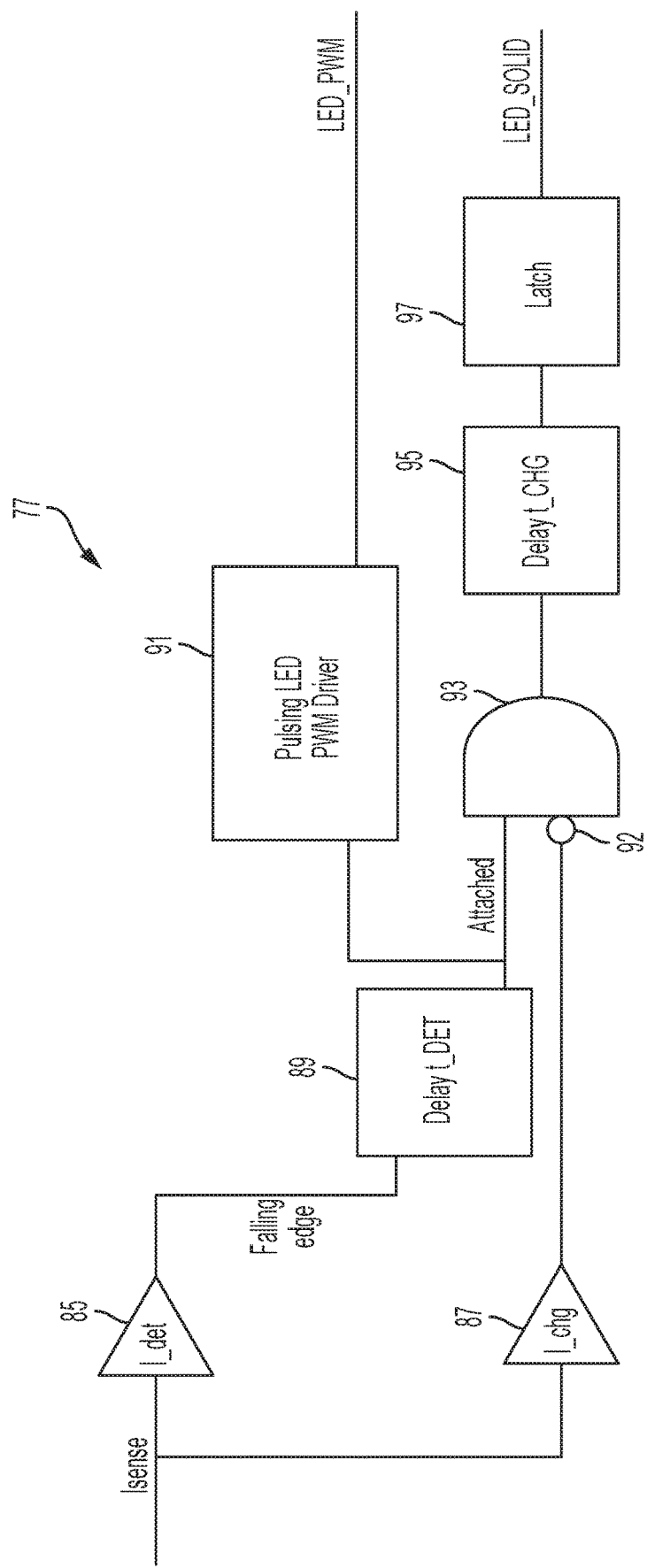
FIG. 7 is a logic diagram of an example of circuitry that may be utilized in the charging cable of FIG. 6 to control a perceptible visible output to indicate various connection and charging states.

FIG. 7 illustrates an example of an arrangement of discrete logic circuits for implementing the current responsive logic circuitry 77. As noted earlier, current sensing for state detection may be implemented without pulse modulation. In the example logic of FIG. 7, however, the logic implements timing associated with detection of pulse modulated current.

The functions of the logic circuitry 77 could be implemented in other ways, for example with an MCU or other programmed processor. Also, the example logic circuitry 77 of FIG. 7 is configured to sense and indicate various states of a profile like that of the example shown in FIG. 5. A battery charging circuit and MCU may be configured to produce a different current draw profile, e.g. for a different type of battery; in which case, the logic circuitry 77 of the charging cable 15 may be changed as appropriate to sense the states of the different current draw profile.

With reference to FIGS. 6 and 7, the illustrated example of the switching logic circuitry 77 includes two comparators 85 and 87. A voltage Isense from the current sensor 73 (FIG. 6) is proportional to the instantaneously sensed current, and the Isense voltage is coupled to an input of each of the comparators 85 and 87. The comparator 85 determines whether or not the Isense voltage meets or exceeds an I_det reference voltage that is proportional to the lower current threshold I_detect used for connection state detection. The comparator 85 provides a relatively high output voltage (e.g. a 1) when the voltage Isense representing sensed current is at or above (greater than or equal to) the reference voltage I_det. If Isense is below the I_det reference, then the comparator 85 outputs a low voltage (e.g. a 0). The comparator 87 determines whether or not the Isense voltage meets or exceeds an I_chg reference voltage that is proportional to the higher current threshold I_chg used for charging state detection. The comparator 87 provides a relatively high output voltage (e.g. a 1) when the voltage Isense representing sensed current is at or above (greater than or equal to) the reference voltage I_chg. If Isense is below the I_chg reference, then the comparator 87 outputs a low voltage (e.g. a 0). The comparators 85, 89 are sufficiently responsive so as to respond to the peaks and valleys of the pulses of the two different amplitudes modulated on the current draw in different states, as shown by way of example in FIG. 5.

If the cable 15 is connected to a chargeable device 11, the comparator 85, for example, will provide a steady high output voltage throughout the precharge/trickle state, throughout the constant current state, and during a higher current-flow portion of the constant voltage state. The comparator 85 will provide a periodically pulsed high-low output during the lower current-flow portion of the constant voltage state and the end of charge (EOC) states in response to the pulse modulation of the current by the device 11. The comparator 85 will provide a low output when there is no current (or no pulses) to trip the low I_detect threshold, when there is no device 11 connected to the cable 15.

The comparator 89, in such an example, will provide a high output voltage throughout the constant current state and during the higher current flow portion of the constant voltage state. The comparator 89 will provide a periodically pulsed high-low output during the precharge/trickle state in response to the pulse modulation of the current by the device 11. The comparator 89 will provide a low output when there is no current (or no pulses) to trip the higher I_chg threshold. The low output will include the low current flow portion of the constant voltage state and during the end of charge (EOC) state as well as any time when there is no device 11 connected to the cable 15.

The example state sensing and indication logic 77 includes a delay circuit 89 coupled to receive the output from the comparator 85. The circuit 89 implements a delay time interval t_DET relative to each falling edge of the output of the comparator 85 (e.g. in response to each transition when the value Isense representing the sensed current falls below the I_det threshold).

The example state sensing and indication logic 77 also includes a pulse width modulation (PWM) type driver circuit 91, for outputting a periodic signal, in this case the LED_PWM signal for periodically closing and opening the switch 79 and pulsing the light output from the LED 75 ON and OFF. The PWM driver circuit 91 receives the output from the delay circuit 89 to activate/deactivate the pulsed signal output of the driver circuit 91 and thus the pulsing output of the LED 75.

The example state sensing and indication logic 77 also includes an inverter 92 coupled to one of the inputs of an AND gate 93. The output of the comparator 87 is connected to the inverter 92 so that the inverted comparator signal is applied to the one input of the AND gate 93. The AND gate 93 receives the output from the delay circuit 89 on the other input of the AND gate 93.

The example state sensing and indication logic 77 also includes another delay circuit 95, which implements a delay time interval t_CHG. The output of the AND gate 93 goes to input of the delay circuit 95; and the output of the delay circuit 95 goes to a latch 97. The latch 97 toggles between high and low output states and respectively holds those states, in response to the signal from the delay circuit 95. The output of the latch 97 is the LED_SOLID signal that operates the switch 81. When the latch output is high, the signal closes the switch 81, turning ON the LED 75 for a steady ON state as long as the latch 97 maintains the high state output. When the latch output is low, the signal opens the switch 81, turning OFF the LED 75 for a steady OFF state as long as the latch 97 maintains the low state output.

Further discussions will concurrently reference FIGS. 6 and 7 and various ones of the timing diagrams of FIGS. 8 to 14. A general discussion of the logic follows first, without yet addressing portions of the current draw profile that include the current modulation pulses. Aspects of the delay intervals versus the parameters of the different amplitude modulation pulses will be described later.

Figure 8:
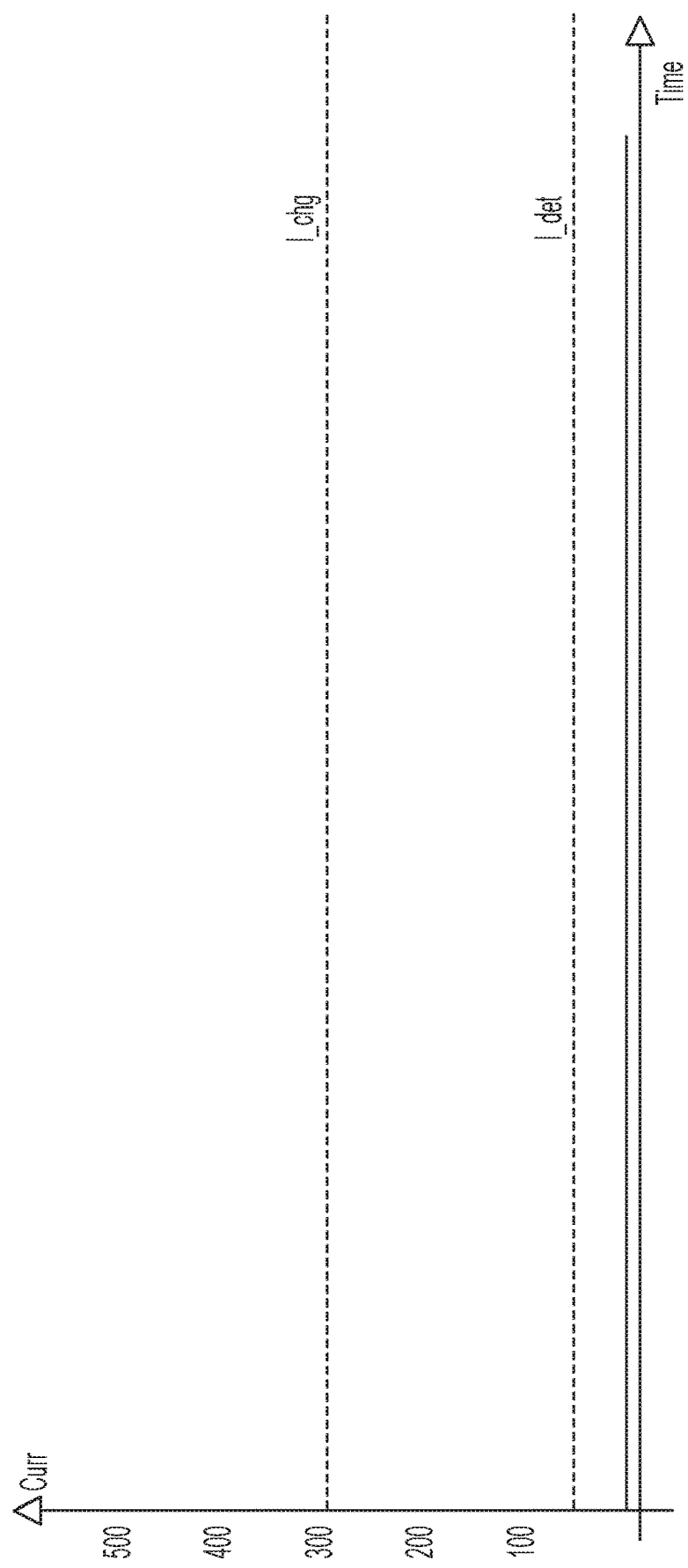
FIGS. 8, 9, 10, 11, 12, 13, and 14 are graphs of examples of sensed current over time in relation to the two thresholds, in several different system states as sensed and indicated using circuitry like that of FIG. 7.

In general, when the voltage Isense representing sensed current is below the reference voltage I_det for a substantial period as shown in FIG. 8 (disconnected, LED off), the comparator 85 outputs a low voltage (e.g. a 0). In response, the delay circuit 89 outputs a low voltage (e.g. a 0). The driver 91 remains off, and there is no signal on the LED_PWM lead to operate the switch 79. The switch 79 remains open. In this state, the voltage Isense representing sensed current also is below the reference voltage I_chg for a substantial period as shown in FIG. 8, and the comparator 87 outputs a low voltage (e.g. a 0). Although the inverter 92 will provide a high (e.g. 1) value on one input of the AND gate 93, the AND gate 93 outputs a low voltage (e.g. a 0) in view of the low (0) input from the delay circuit 89. In response to the low (0) output from the AND gate 93, the delay circuit 95 outputs a low voltage (e.g. a 0) and the latch 97 outputs a low voltage (e.g. a 0) on the LED_SOLID lead going to the switch 81. The switch 81 remains open. In this state with both switches open, no current flows through the LED 75, and there is no light output (steady OFF), which serves as a perceptible indication that there is no chargeable device 11 connected to the charging cable 15.

When the voltage Isense representing sensed current is at or above (greater than or equal to) the reference voltage I_det, the comparator 85 outputs a higher voltage (e.g. a 1). In response, the delay circuit 89 outputs a higher voltage (e.g. a 1) to activate the pulsing LED driver 91. The driver 91 outputs pulses on the lead LED_PWM to periodically open and close the switch 79. Assuming for the moment that the switch 81 is open, pulsing current will flow through the LED 75 as the switch 79 opens and closes causing the LED 75 to provide a pulsing or 'breathing' light output at least signifying that a chargeable device 11 is connected to the charging cable 15. In the example, however, the logic 77 is configured to apply the I_chg threshold so as to implement the pulsing output from the LED 75 to further indicate that the connected chargeable device 11 is charging the battery 61 of the device 11.

Figure 9:
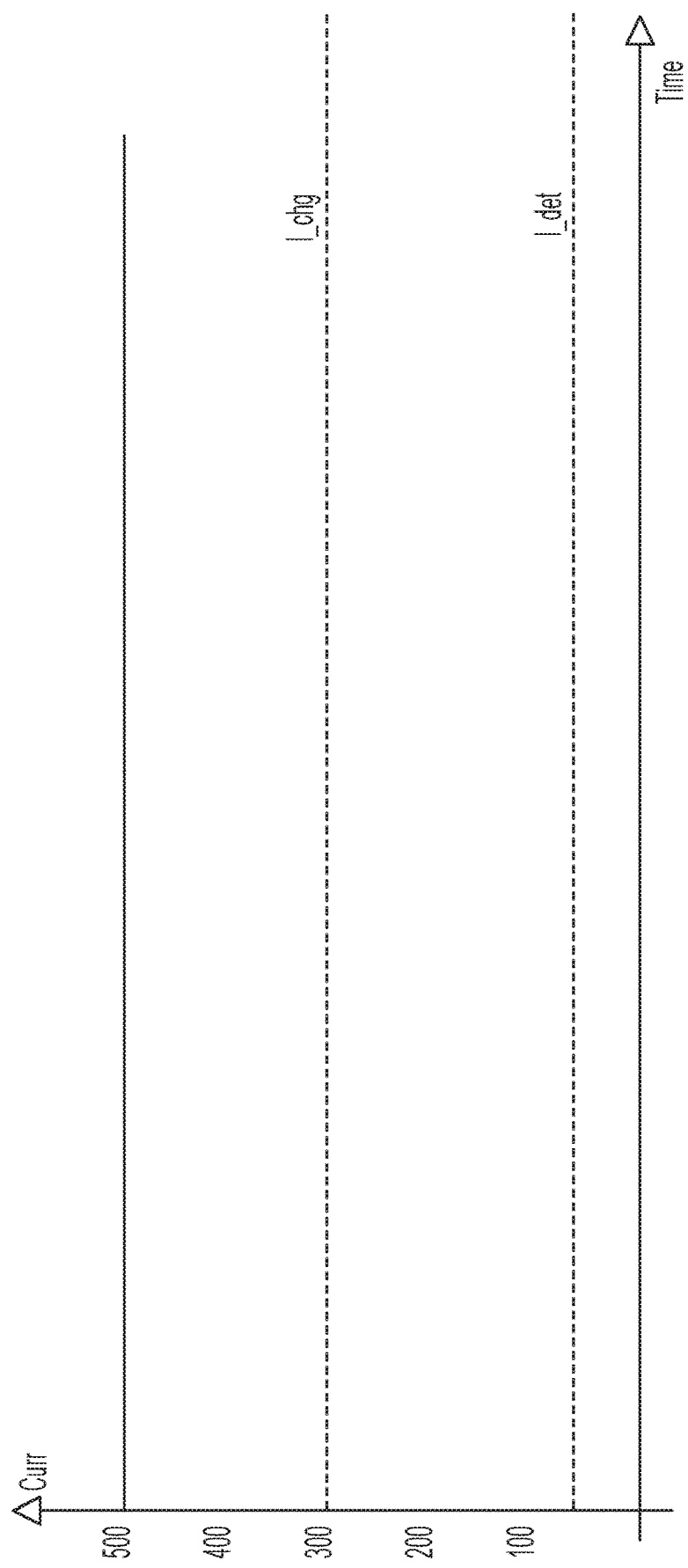

The illustrated logic (FIG. 7) keeps the switch 81 open while there is a chargeable device 11 connected to the charging cable 15 and the voltage Isense representing sensed current is at or above (greater than or equal to) the I_chg reference voltage (see FIG. 9). The current will steadily exceed both thresholds as shown in FIG. 9 (charging, LED pulsing), for example, during the constant current flow portion of the profiles shown in FIGS. 4 and 5. In the state depicted in FIG. 9, the pulsing light produced by the driver 91, the switch 79 and the LED 75 indicates that the connected device 11 is drawing current to charge the battery. With the illustrated logic circuits, when the voltage Isense representing sensed current is at or above (greater than or equal to) the charging state reference voltage I_chg, the comparator 87 outputs a higher voltage (e.g. a 1), which the inverter 92 converts to a low voltage (0) on the input of the AND gate 93. Although the other input of the AND gate 93 is high (1) because the voltage Isense tripped the lower I_det threshold of the comparator 85, the AND gate 93 outputs a low voltage (0) due to the low (0) input from the inverter 92. In response to the low (0) output from the AND gate 93, the delay circuit 95 outputs a low voltage (e.g. a 0) and the latch 97 outputs a low voltage (e.g. a 0) on the LED_SOLID lead going to the switch 81. The switch 81 remains open. In this state with the current at or above the higher I_chg threshold for charge state detection, the logic 77 holds switch 81 open, which allows the pulsed light output from the LED 75 to indicate device charging.

Figure 10:
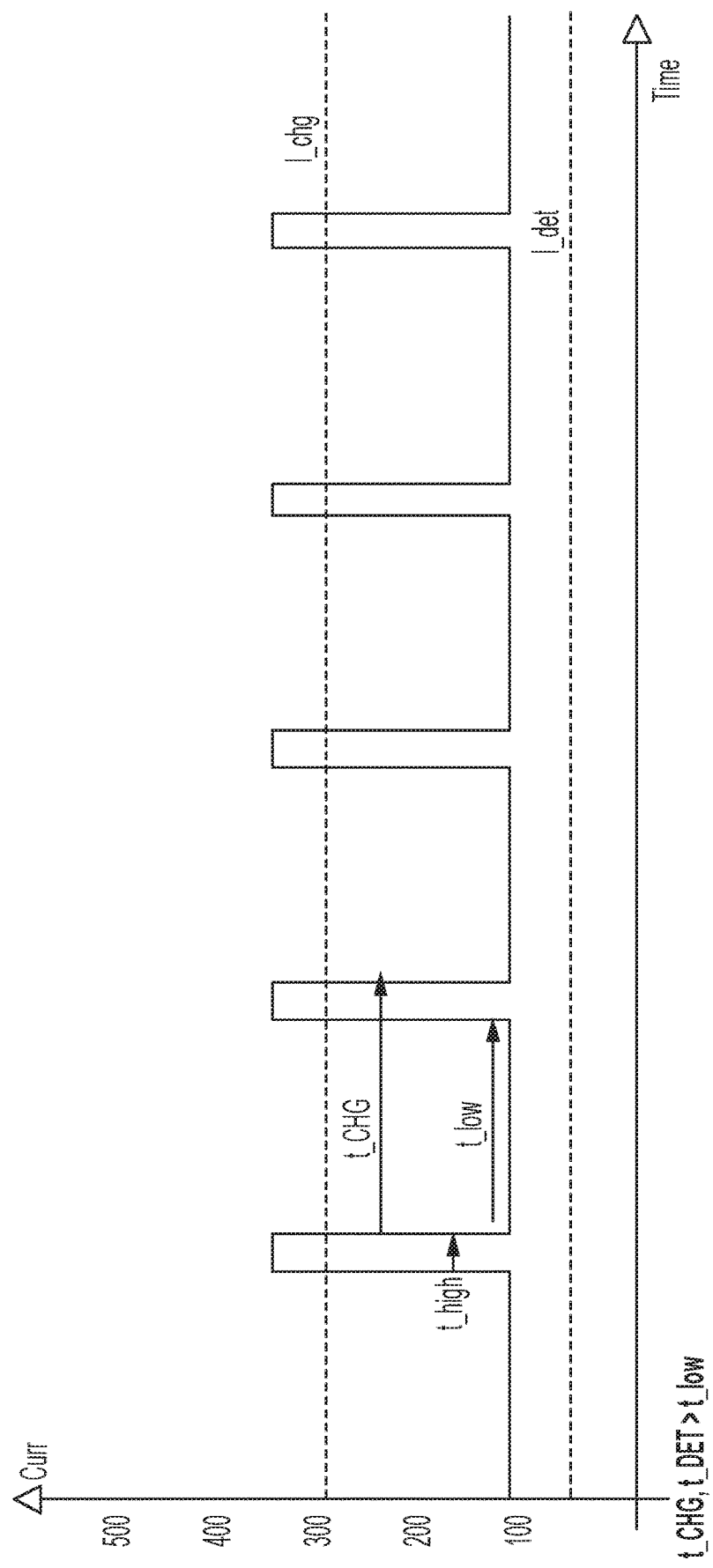
Figure 11:
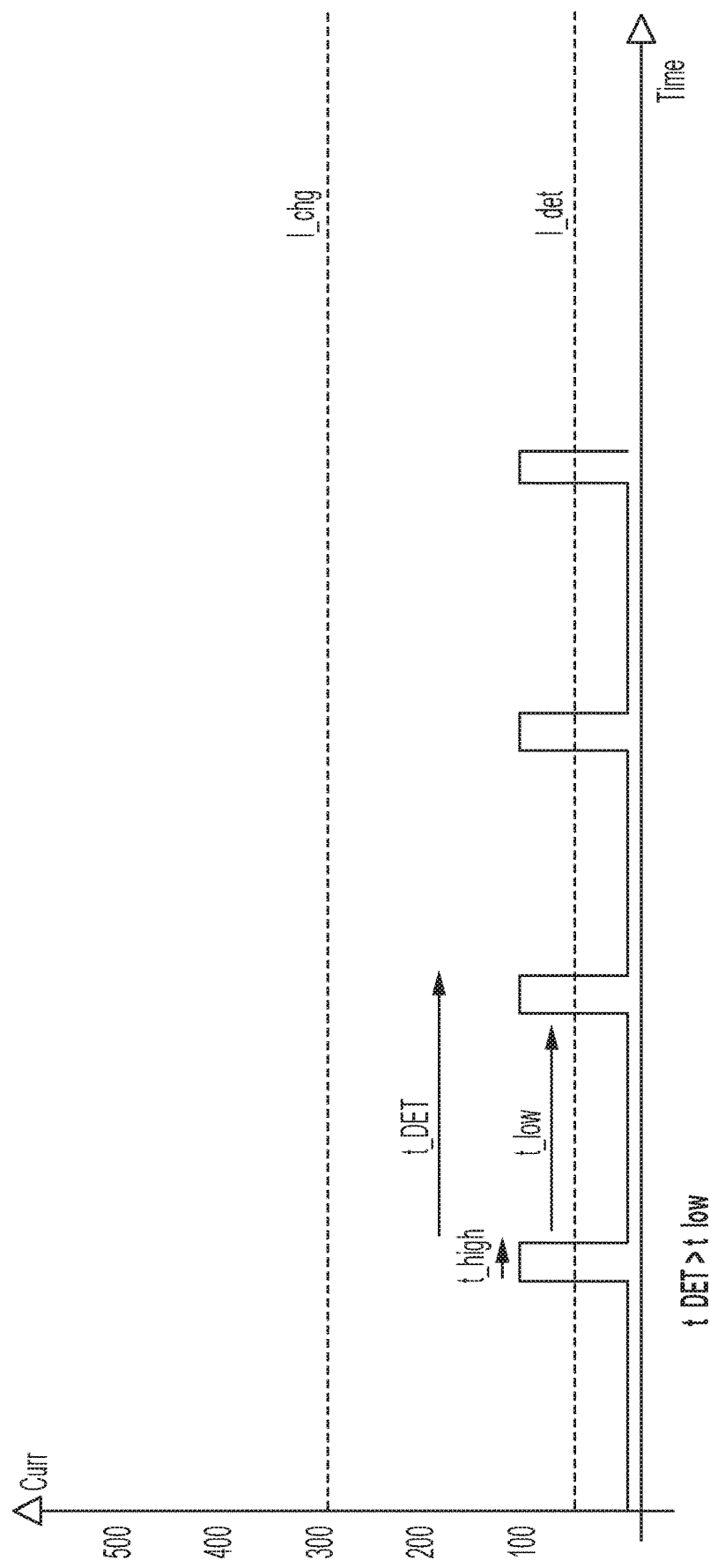

As outlined above, FIG. 9 represents the situation in which the current is continuously above the higher I_chg threshold, e.g. during the constant current phase of the current draw profile. The precharge/trickle phase of the current draw profile presents a different situation, which the example device circuitry 17 and cable circuitry 31 address by the addition and detection of modulation pulses. FIG. 10 is an example of the levels of the pulse modulated current and the threshold levels in the precharge state. The device 11 is connected to the cable 15, and the device 11 is drawing some current to charge the battery 61. As will be discussed later, FIG. 11 shows similar pulse timing for the pulses of the lower amplitude added during the low current part of the constant voltage portion and during the EOC portion of the current draw profile (FIG. 5).

In general, the time interval when a modulation pulse is high is referred to as t_high, and the period when a modulation pulse is low is referred to as t_low. Although those lengths of time may vary between the pulses of the different amplitudes, the drawings (e.g. FIGS. 10 and 11) show an example in which t_high, and t_low are substantially the same for the corresponding high and low levels of both types of pulses.

Turning now specifically to the precharge state, FIG. 10 (pre-charging, LED pulsing) shows pulse timing for the pulses of the higher amplitude added during the precharge portion of the current draw profile (FIG. 5). The chargeable device circuitry 17 (FIG. 4) is configured to operate switch 66 to generate the modulation pulses of sufficient magnitude so that the current in the precharge state periodically rises above the charge state threshold I_chg. Also, the current is continuously above the connection state threshold I_det but is below the charging state threshold except when the current sensor 73 detects a peak amplitude of a current modulation pulse.

The intent in the precharge state is to provide the pulsed LED output as an indication of connection and charging, much like in the state discussed earlier relative to FIG. 9. For that purpose, the PWM driver 91 will drive the switch 79 to periodically open and close and thus pulse the current flow through the LED 75. As in the discussion of FIG. 9, the voltage Isense representing sensed current is at or above the reference voltage I_det, therefore the comparator 85 outputs a higher voltage (e.g. a 1), and the delay circuit 89 outputs a higher voltage (e.g. a 1) to activate the pulsing LED driver 91 and periodically open and close the switch 79. Concurrently, in this state, the switch 81 will be held open (so as not to override the pulsing via operation of the switch 79).

As outlined above, while the current is above the threshold I_det, the outputs of the comparator 85 and the delay circuit 89 are high, and the AND gate 93 receives a high input from the delay circuit 89. Whenever the voltage Isense representing sensed current is at or above the reference voltage I_chg, the comparator 87 outputs a higher voltage (e.g. a 1), which the inverter 92 converts to a low voltage (0) on the input of the AND gate 93. In the state illustrated in FIG. 10, the comparator 87 outputs the higher voltage (e.g. a 1) in response to each peak of a current modulation pulse which causes the sensed current to meet or exceed the I_chg threshold. Otherwise, the comparator 89 outputs a lower voltage (e.g. a 0). Hence the output of the comparator is a series of pulses essentially corresponding to the timing of the current pulses of FIG. 10, and the inverter 92 provides an inverse of that pulse train output of the comparator 89 to one input of the AND gate 93. With the input from the delay circuit 89 continuously high, the output of the AND gate 93 tracks the input received from the inverter 92, i.e. an inverse of the output of the comparator 89 and thus an inverse of the pulses of the modulated current of FIG. 10.

With the inverter 92 and AND gate 93 arranged as shown, the output of the AND gate 93 goes high at approximately the same time that a current pulse (and thus the output of the comparator 87) goes low; and the output of the AND gate 93 goes low at approximately the same time that a current pulse (and thus the output of the comparator 87) goes high. The pulses only periodically trip the charging state threshold I_chg. The delay circuit 95, in the logic path to the LED_SOLID lead that controls the switch 81, implements a delay t CHG that may be tailored to match parameters of the current modulation pulses of the higher amplitude. The delay interval t_CHG prevents change of state in intervals (of durations less than or equal to t_CHG) between pulses that exceed the I_chg threshold and thus maintains the output of the latch 87 low and the switch 81 open during the precharge phase of the current draw profile.

The delay circuit 95 is configured so that the output of the circuit 95 generally has a high value (e.g. representing a 1)

when the output from the AND gate 93 has a high value (e.g. a 1 when both inputs to gate 93 are 1s). The delay circuit 95 is configured so that the output of the circuit 95 generally has a low value (e.g. representing a 0) when the output from the AND gate 93 has a low value (e.g. a 0 when at least one of the inputs to gate 93 is a 0). The output of the delay circuit 95 is intended to be low in charging states. For the precharge state, the delay circuit 95 is configured so that the output of the circuit 95 goes from low to high in response to a rising edge of the output of the gate 93 (corresponding to a falling edge of the current pulse), but only after expiration of delay interval of t_CHG following the transition of the signal output from the AND gate 93. However, the circuit 95 resets counting for the delay interval if the input of the circuit 95 goes low again (corresponding to a rising edge of a subsequent current pulse) before expiration of delay interval of t_CHG. In this way, if there is another current pulse represented by the low of the AND gate output, the delay circuit 95 keeps the latch 97 set to output a low signal to hold switch 81 open, so as not to override the pulsing of the LED output from the PWM driver 91 and the switch 79.

Aspects of the timing in relation to the pulses, implemented by the actual example logic circuitry 77 in the EOC state, are discussed next. In that connected state, there is no current flow sufficient for active charging of the battery, and the level of current detected by the current sensor is below the first, higher threshold but is still at or above the second, lower threshold. Before discussing the implementation with the pulse modulation, consider an example (not shown) in which the idle current in the EOC state of the device is higher than the low connection state detection threshold I_det (e.g. as if the EOC current was higher in FIG. 4 or the threshold I_detect was sufficiently lower in FIG. 4). In such a state, the device 11 is connected to the charging cable 15 but the charger circuit 63 of the device 11 is not charging the battery 61. Hence, the voltage Isense representing sensed current is below the reference voltage I_chg for a substantial period, and the comparator 87 outputs a low voltage (e.g. a 0). The inverter 92 will provide a high (e.g. 1) value on one input of the AND gate 93. The voltage Isense representing sensed current is at or above (greater than or equal to) the reference voltage I_det, the comparator 85 outputs a higher voltage (e.g. a 1). In response, the delay circuit 89 outputs a higher voltage (e.g. a 1) to the other input of the AND gate 93. With high (1) values on both inputs, the AND gate 93 outputs a high (1) value. The delay circuit 95 output goes high (1), which activates the latch 97 to output a voltage on the LED_Solid lead to close the switch 81. While the EOC state persists, the latch output remains high, the switch 81 remains closed and current flows steadily through the LED 75 to indicate that the connected device 11 is connected but not charging or charging at a relatively low rate during a secondary charging state, e.g. the battery is in a fully charged (EOC) state. Although the switch 79 is opening and closing in this state, the continuous closure of the switch 81 effectively overrides the pulsing via the switch 79 so that the visible indication appears steady-ON.

By way of an example of the state when charging is done in the system using the example circuitry, FIG. 11 (done charging, LED solid) shows pulses of the current flow, including the current modulation pulses from the chargeable device 11, when the battery charger has reached the end of charging (EOC) low current state (see also FIG. 5). Again, the time interval when a modulation pulse is high is referred to as t_high, and the period when a modulation pulse is low is referred to as t_low. The chargeable device circuitry 17 (FIG. 4) is configured to operate switch 65 to generate the modulation pulses. In this state, the low amplitude modulation pulses do not trip the charge state current threshold I_chg. The low amplitude modulation pulses, however, are of sufficient magnitude so that the current periodically rises above the I_det threshold. The peaks of the Isense output voltage therefore exceed the I_det reference voltage used by the comparator 85 (FIG. 7), causing periodic high outputs from the comparator to the input of the delay circuit 89 which in turn activates the PWM driver 91 to pulse the current to the LED 75 via the switch 79. The delay interval t_DET keeps the output of the delay circuit 89 high as long as any period between pulses has a duration of less than t_DET and thus provides a steady higher voltage (1) to the input of the AND gate 93.

As shown in FIG. 11, in this state, the I_sense voltage representing the sensed modulated current does not exceed the higher I_chg threshold, which indicates that the device 11 is not charging the battery through the cable 15. The comparator 87 outputs a low voltage (0) that the inverter converts to a higher voltage (1) input to the AND gate 93. That AND gate 93, delay circuit 95 and latch 97 (FIG. 7) close the switch 81 (FIG. 6) so that there is a constant current flow through the LED 75. The constant current provided through closed switch 81 effectively overrides the pulsed current through switch 79. Hence, the LED provides a steady ON light output indicating connection but no charging, e.g. that the battery 61 is, or nearly is, fully charged.

As outlined above, the output of the comparator 85 goes to the delay circuit 89. The delay circuit 89 is configured so that the output of the circuit 89 generally has a high value (e.g. representing a 1) when the output from the comparator 85 has a high value (e.g. a 1 while the sensed current value Isense meets or exceeds the I_det threshold). The delay circuit 89 also is configured so that the output of the circuit 89 goes from high to low in response to a falling edge of the signal on the output from the comparator 85, but only after expiration of delay interval of t_DET following the falling edge of the signal output from the comparator 85. However, the circuit 89 resets counting for the delay interval if the input of the circuit 89 goes high again before expiration of delay interval of t_DET.

More specifically, the delay circuit 89 detects the falling edge of the output of the comparator 85 at the end of one pulse but waits before toggling to a low output. When a subsequent pulse peak above the I_det threshold is detected via the sensor 73 and the comparator 85, the output of the comparator 85 goes high again, and the delay circuit 89 stops its counting of time for the delay interval of t_DET. In this way, the output of delay circuit 89 remains high as long as pulses are received with valleys or minimums each having durations t_low less than the delay interval of t_DET.

For example, after a period of disconnection (longer than t_DET), the delay circuit 89 outputs a high value so long as the output of the comparator 85 remains high, e.g. during the precharge/trickle charge part of the current draw profile, the high constant current part of the current draw profile and some of the constant voltage part of the current draw profile. The delay circuit 89 may detect a falling edge of the comparator output signal in response to disconnection of the chargeable device 11 from the cable 15; and in that situation, the output of the delay circuit 89 subsequently goes low upon expiration of the delay interval of t_DET following the falling edge of the output of the comparator 85 (representing the sensed disconnection) and stays low so long as there is no device 11 connected to the cable 15, as indicated by the 0 output by the comparator 85. The delay circuit 89, however, is configured so that the delay interval of t_DET exceeds the duration t_low of each of the valleys of the modulation pulses, at least for the pulses of the lower amplitude. When the current drawn by the device 11 would otherwise fall below the I_det threshold, e.g. during a low current portion of the constant voltage state and the end of charge (EOC) state, the comparator 85 periodically pulses between low and high values due to the pulse modulation of the current. The comparator 85 will output a high value in response to each peak of a current pulse that equals or exceeds the I_det threshold and will output a low value in response to each valley that is below that threshold. The delay interval of t_DET of circuit 89, however, causes circuit 89 to maintain its high output state so long as a successive one of the current pulses is received and the comparator 85 provides corresponding low-high transition separated by low output levels of duration t_low less than t_DET.

Figure 12:
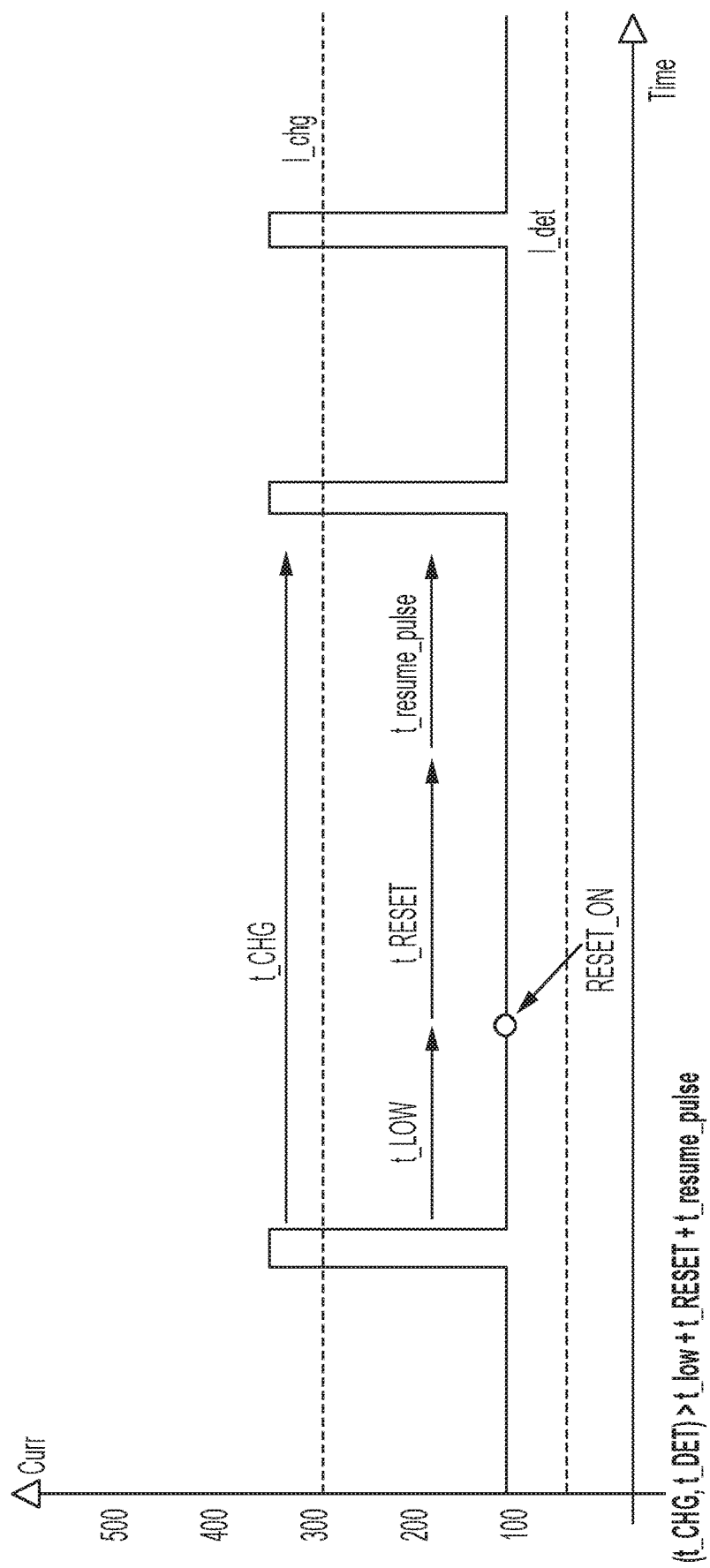
Figure 13:
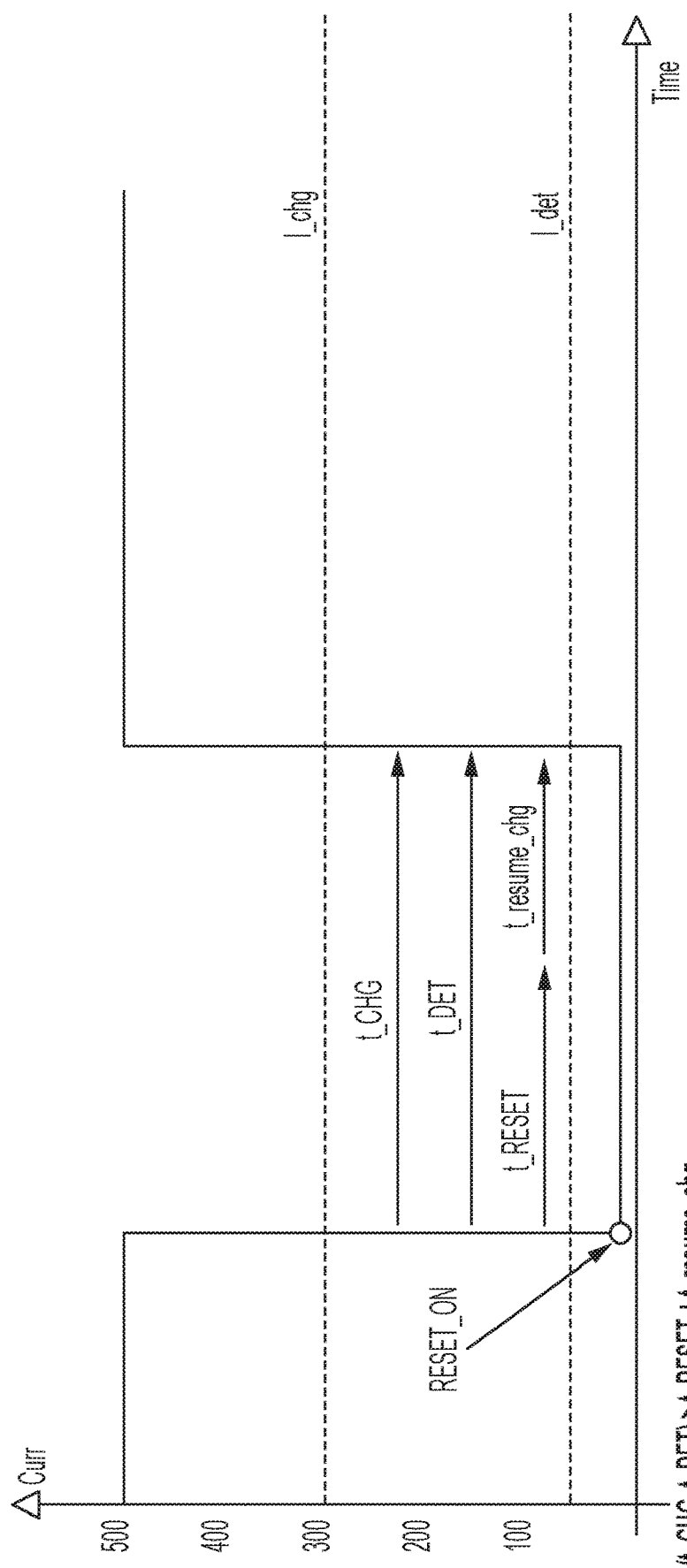
Figure 14:
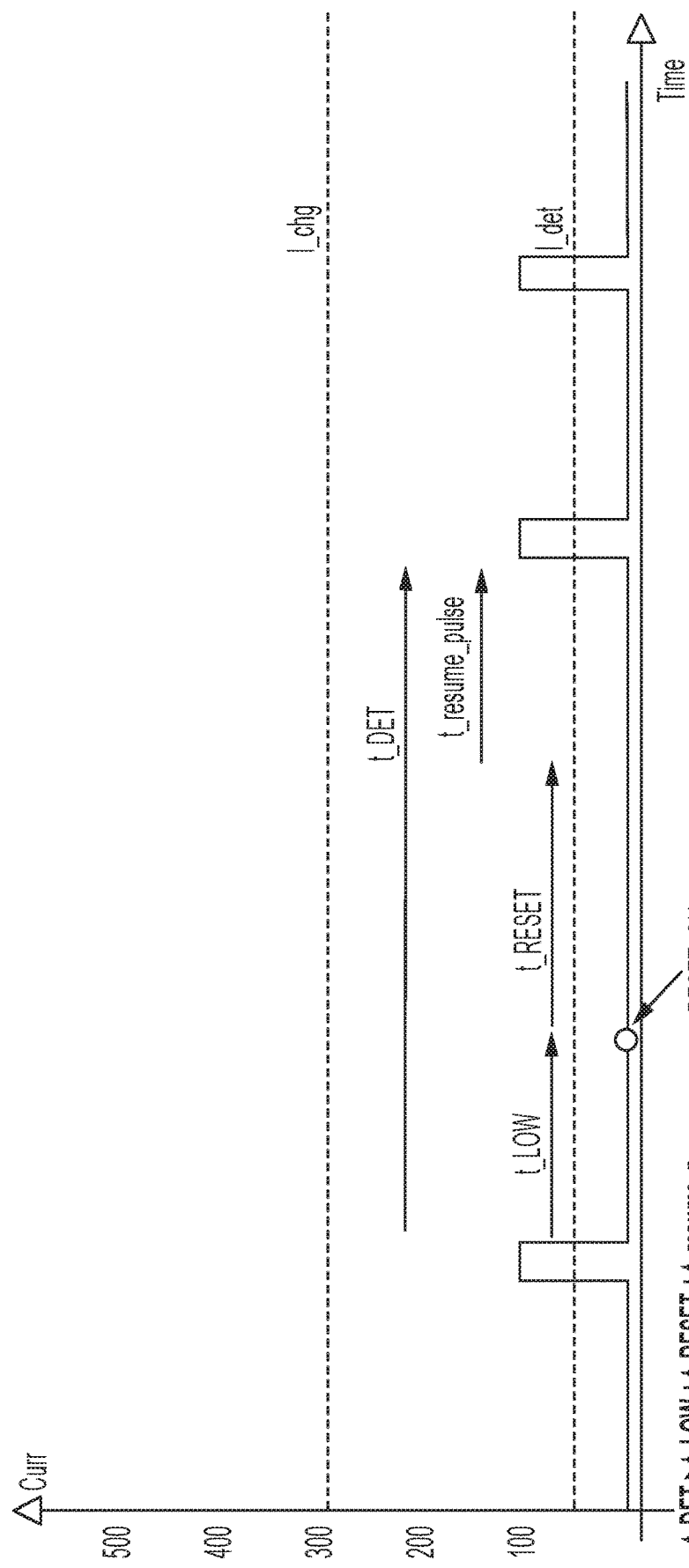

FIGS. 12 (pre-charging, LED pulsing, RESET), 13 (charging, LED pulsing, RESET), and 14 (done charging, LED solid, RESET) show reset and resume features that may be implemented in combination with the current responsive detections and state indications of FIGS. 9 to 11. FIG. 12 relates to reset during the precharge phase of the current draw profile (compare to FIG. 10), FIG. 13 relates to reset during a charging phase when the LED has been pulsing due to an otherwise continuous high current flow (e.g. during the constant current phase, compare to FIG. 9), and FIG. 14 relates to reset during the EOC phase while a chargeable device is still connected (compare to FIG. 11). In the timing diagram for FIG. 14, the worst case scenario is when reset occurs right before the pulse occurs (i.e., after t_LOW). FIGS. 15A to 15C summarize the examples of the time intervals implemented by delay elements included in the example logic circuitry of FIG. 7 relative to the pulse timing conditions, for various states as shown in FIGS. 9 to 14. Aspects of the reset and resume features should be readily understood from the drawings.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises or includes a list of elements or steps does not include only those elements or steps but may include other elements or steps not expressly listed or inherent to such process, method, article, or apparatus. An element preceded by "a" or "an" does not, without further constraints, preclude the existence of additional identical elements in the process, method, article, or apparatus that comprises the element.

Unless otherwise stated, any and all measurements, values, ratings, positions, magnitudes, sizes, and other specifications that are set forth in this specification, including in the claims that follow, are approximate, not exact. Such amounts are intended to have a reasonable range that is consistent with the functions to which they relate and with what is customary in the art to which they pertain. For example, unless expressly stated otherwise, a parameter value or the like, whether or not qualified by a term of degree (e.g. approximate, substantially or about), may vary by as much as ±10% from the recited amount.

Although an overview of the inventive subject matter has been described with reference to specific examples, various modifications and changes may be made to these examples without departing from the broader scope of examples of the present disclosure. Such examples of the inventive subject matter may be referred to herein, individually or collectively, by the term "invention" merely for convenience and without intending to voluntarily limit the scope of this application to any single disclosure or inventive concept if more than one is, in fact, disclosed.

The examples illustrated herein are described in sufficient detail to enable those skilled in the art to practice the teachings disclosed. Other examples may be used and derived therefrom, such that structural and logical substitutions and changes may be made without departing from the scope of this disclosure. The Detailed Description, therefore, is not to be taken in a limiting sense, and the scope of various examples is defined only by the appended claims, along with the full range of equivalents to which such claims are entitled.

What is claimed is:

1. A system, comprising:
   a chargeable device including:
      a battery;
      a battery charger circuit coupled to the battery; and
      a receiver including contact pads coupled to the battery charger circuit and to ground of the chargeable device;
   a charging cable including:
      a power bus;
      a ground bus;
      a cable head having power and ground pins coupled respectively to the power and ground buses and configured to engage the contact pads, when the cable head is coupled to the receiver of the chargeable device;
      a current sensor coupled to at least one of the buses to detect current flow via the pins of the cable head;
      a state indicator for providing an output perceptible to a user; and
      logic circuitry coupled to operate the state indicator, configured to compare level of current detected by the current sensor to first and second thresholds,
      wherein: the first threshold is higher than the second threshold; and in response to results of the comparison, the logic circuitry is further configured to:
         control the state indicator to provide a perceptible output of a first type indicating the cable head is not electrically coupled to the receiver, when the level of current detected by the current sensor is below the second threshold;
         control the state indicator to provide a perceptible output of a second type indicating the cable head is electrically coupled to the receiver and the current flow is charging the battery of the chargeable device in a primary charging state, when the level of current detected by the current sensor is at or above the first threshold; and
         control the state indicator to provide a perceptible output of a third type indicating the cable head is electrically coupled to the receiver but the current flow is not charging the battery of the chargeable device or is charging the battery of the chargeable device in a secondary charging state, when the level of current detected by the current sensor is below the first threshold and is at or above the second threshold.

2. The system of claim 1, wherein:
the receiver of the chargeable device comprises a cable plug;
the contact pads are located on the cable plug;
the cable head comprises a socket having a recess configured to accept the cable plug to rotatably couple the socket of the cable head to the cable plug of the receiver of the chargeable device; and
the power and ground pins protrude into the recess of the socket of the cable head to respectively contact the contact pads of the cable plug, when the cable plug is accepted in the recess of the socket of the cable head.

3. The system of claim 1, wherein the chargeable device further includes:
at least one switch coupled to draw current from the battery charger circuit; and
a device controller responsive to power received from the cable via the contact pads of the receiver, configured to operate the at least one switch to:
when current flow would be below the first threshold and be at or above the second threshold, pulse modulate current through the contact pads of the receiver with a first pulse amplitude sufficient to periodically meet or exceed the first threshold; and
when current flows but the current flow would be below the second threshold, pulse modulate current through the contact pads of the receiver with a second pulse amplitude sufficient to periodically meet or exceed the second threshold;
wherein first pulse amplitude is higher than the second pulse amplitude.

4. The system of claim 3, wherein the logic circuitry of the cable is further configured to implement timing logic relative to length of pulses of the current detected by the current sensor to:
operate the state indicator to maintain the perceptible output of the second type while the current sensor periodically detects peaks of modulated current pulses at or above the first threshold; and
operate the state indicator to maintain the perceptible output of the third type while the current sensor periodically detects peaks of modulated current pulses at or above the second threshold and below the first threshold.

5. The system of claim 4, wherein the device controller is further configured to control the battery charger circuit to implement a charging current profile comprising:
a precharge trickle current flow during a first part of the profile at a level below the first threshold and at or above the second threshold;
a constant current flow during a second part of the profile at a level at or above the second threshold;
a constant voltage during a third part of the profile during which current flow declines from a level of the constant current flow to a minimum level, due to increasing charge stored on the battery; and
continued minimum level current flow in a fourth part of the profile in which the battery has reached a fully charged state.

6. The system of claim 5, wherein the device controller is further configured to operate the at least one switch coupled to the battery charger circuit to:

pulse modulate current through the contact pads with the first pulse amplitude only during precharge trickle current flow in the first part of the profile; and
pulse modulate current through the contact pads with the second pulse amplitude only: during a lower current flow portion of the third part of the profile or during the fourth part of the profile.

7. The system of claim 1, wherein the logic circuitry of the cable is further configured to operate the indicator to:
provide a steady-OFF output as the perceptible output of the first type indicating the cable head is not electrically coupled to the receiver;
provide a pulsing output as the perceptible output of the second type indicating the cable head is electrically coupled to the receiver and the current flow is charging the battery of the chargeable device in the primary charging state; and
provide a steady-ON output as the perceptible output of the third type indicating the cable head is electrically coupled to the receiver but the current flow is not charging the battery of the chargeable device or is charging the battery of the chargeable device in the secondary charging state.

8. A charging cable, comprising:
a power bus;
a ground bus;
a cable head having power and ground pins coupled respectively to the power and ground buses and configured to engage contact pads of a receiver of a chargeable device having a battery,
when the cable head is coupled to the receiver of the chargeable device;
a current sensor coupled to at least one of the buses to detect current flow via the pins;
a state indicator for providing an output perceptible to a user; and
logic circuitry coupled to operate the state indicator, configured to compare level of current detected by the current sensor to first and second thresholds,
wherein: the first threshold is higher than the second threshold; and in response to results of the comparison, the logic circuitry is further configured to:
control the state indicator to provide a perceptible output of a first type indicating the cable head is not electrically coupled to the receiver, when the level of current detected by the current sensor is below the second threshold;
control the state indicator to provide a perceptible output of a second type indicating the cable head is electrically coupled to the receiver and the current flow is charging the battery of the chargeable device in a primary charging stage, when the level of current detected by the current sensor is at or above the first threshold; and
control the state indicator to provide a perceptible output of a third type indicating the cable head is electrically coupled to the receiver but the current flow is not charging the battery of the chargeable device or is charging the battery of the chargeable device in a secondary charging state, when the level of current detected by the current sensor is below the first threshold and is at or above the second threshold.

9. The charging cable of claim 8, wherein:
the cable head comprises a socket having a recess configured to accept a cable plug of the receiver bearing the contact pads, to rotatably couple the socket of the cable head to the cable plug of the receiver of the chargeable device; and the power and ground pins protrude into the recess of the socket of the cable head to respectively contact the contact pads of the cable plug, when the cable plug is accepted in the recess of the socket of the cable head.

10. The charging cable of claim 8, wherein the logic circuitry of the cable is further configured to implement timing logic relative to length of pulses of modulated current detected by the current sensor to:
   operate the state indicator to maintain the perceptible output of the second type while the current sensor periodically detects peaks of modulated current pulses at or above the first threshold; and
   operate the state indicator to maintain the perceptible output of the third type while the current sensor periodically detects peaks of modulated current pulses below the first threshold and at or above the second threshold.

11. The charging cable of claim 8, wherein the logic circuitry is further configured to operate the indicator to:
   provide steady-OFF output as the perceptible output of the first type indicating the cable head is not electrically coupled to the receiver;
   provide a pulsing output as the perceptible output of the second type indicating the cable head is electrically coupled to the receiver and the current flow is charging the battery of the chargeable device in the primary charging state; and
   provide a steady-ON output as the perceptible output of the third type indicating the cable head is electrically coupled to the receiver but the current flow is not charging the battery of the chargeable device or is charging the battery of the chargeable device in the secondary charging state.

12. A chargeable device, comprising:
   a battery;
   a battery charger circuit coupled to the battery;
   a receiver including contact pads coupled to the battery charger circuit and to ground of the chargeable device;
   at least one switch coupled to draw current from the battery charger circuit; and
   a device controller responsive to power from the contact pads of the receiver, configured to control the battery charger circuit to implement a charging current profile and to operate the at least one switch to:
   pulse modulate current through the contact pads of the receiver with a high pulse amplitude that periodically meets or exceeds a charging state threshold when current flow defined by the charging current profile is at or above a cable connection state threshold but below the charging state threshold; and
   pulse modulate current through the contact pads of the receiver with a low pulse amplitude that periodically meets or exceeds the connection state threshold but not the charging state threshold when current flow defined by the charging current profile would be below the cable connection state threshold, wherein the low pulse amplitude is less than the high pulse amplitude.

13. The chargeable device of claim 12, wherein the device controller is further configured to control the battery charger circuit to implement the charging current profile so as to comprise:
   a precharge trickle current flow during a first part of the profile at a level at or above the cable connection state threshold and below the charging state threshold;
   a constant current flow during a second part of the profile at a level at or above the charging state threshold;
   a constant voltage during a third part of the profile during which current flow declines from a level of the constant current flow to a minimum level, due to increasing charge stored on the battery; and
   continued minimum level current flow in a fourth part of the profile in which the battery has reached a fully charged state.

14. The chargeable device of claim 13, wherein the device controller is further configured to operate the at least one switch coupled to the battery charger circuit to:
   pulse modulate current through the contact pads of the receiver with the high pulse amplitude only during precharge trickle current flow in the first part of the profile; and
   pulse modulate current through the contact pads of the receiver with the low pulse amplitude only during a lower current flow portion of the third part of the profile or during the fourth part of the profile.

* * * * *